(12) United States Patent
Palm

(10) Patent No.: US 8,956,918 B2
(45) Date of Patent: Feb. 17, 2015

(54) METHOD OF MANUFACTURING A CHIP ARRANGEMENT COMPRISING DISPOSING A METAL STRUCTURE OVER A CARRIER

(71) Applicant: Infineon Technologies AG, Neubiberg (DE)

(72) Inventor: Petteri Palm, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 63 days.

(21) Appl. No.: 13/721,337

(22) Filed: Dec. 20, 2012

(65) Prior Publication Data
US 2014/0175624 A1   Jun. 26, 2014

(51) Int. Cl.
*H01L 21/00* (2006.01)

(52) U.S. Cl.
USPC ............ 438/121; 438/612; 438/625; 438/678; 438/123; 257/666; 257/690; 257/686; 257/767; 257/E23.06; 361/707; 361/765

(58) Field of Classification Search
CPC ... H01L 2224/97; H01L 21/568; H01L 22/97; H01L 2224/83005

USPC ......... 438/110, 118, 121, 126, 678, 123, 612, 438/625; 257/767, 686, 690, E23.055, 257/E23.06; 361/707, 751, 765

See application file for complete search history.

(56) References Cited

U.S. PATENT DOCUMENTS

| 5,700,389 | A  | * | 12/1997 | Nakagawa | 252/79.2 |
| 6,459,047 | B1 | * | 10/2002 | Japp et al. | 174/256 |
| 2002/0014689 | A1 | * | 2/2002 | Lo et al. | 257/686 |
| 2005/0124096 | A1 | * | 6/2005 | Appelt et al. | 438/128 |
| 2011/0001245 | A1 | * | 1/2011 | Jobetto | 257/773 |
| 2011/0059582 | A1 | * | 3/2011 | Liu | 438/123 |

* cited by examiner

*Primary Examiner* — Marcos D. Pizarro
*Assistant Examiner* — Cesar Lopez

(57) ABSTRACT

A method for manufacturing a chip arrangement in accordance with various embodiments may include: placing a chip on a carrier within an opening of a metal structure disposed over the carrier; fixing the chip to the metal structure; removing the carrier to thereby expose at least one contact of the chip; and forming an electrically conductive connection between the at least one contact of the chip and the metal structure.

25 Claims, 20 Drawing Sheets

--Prior Art--

--Prior Art--

--Prior Art--

METHOD OF MANUFACTURING A CHIP ARRANGEMENT COMPRISING DISPOSING A METAL STRUCTURE OVER A CARRIER

TECHNICAL FIELD

Various embodiments relate to a method for manufacturing a chip arrangement, and a chip arrangement.

BACKGROUND

Chip arrangements, for example chip packages, may include at least one chip (or die) arranged with a core layer (e.g. embedded in the core layer, for example a metal core layer). Chip arrangements may additionally include at least one passive component (e.g. a resistor and/or a capacitor and/or an inductor) arranged with (e.g. embedded in) the core layer. The core layer may provide an electrical and/or thermal connection to the at least one chip (or die) and/or to the at least one passive component. New ways of manufacturing chip arrangements may be needed.

SUMMARY

A method for manufacturing a chip arrangement in accordance with various embodiments may include: placing a chip on a carrier within an opening of a metal structure disposed over the carrier; fixing the chip to the metal structure; removing the carrier to thereby expose at least one contact of the chip; and forming an electrically conductive connection between the at least one contact of the chip and the metal structure.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1A:
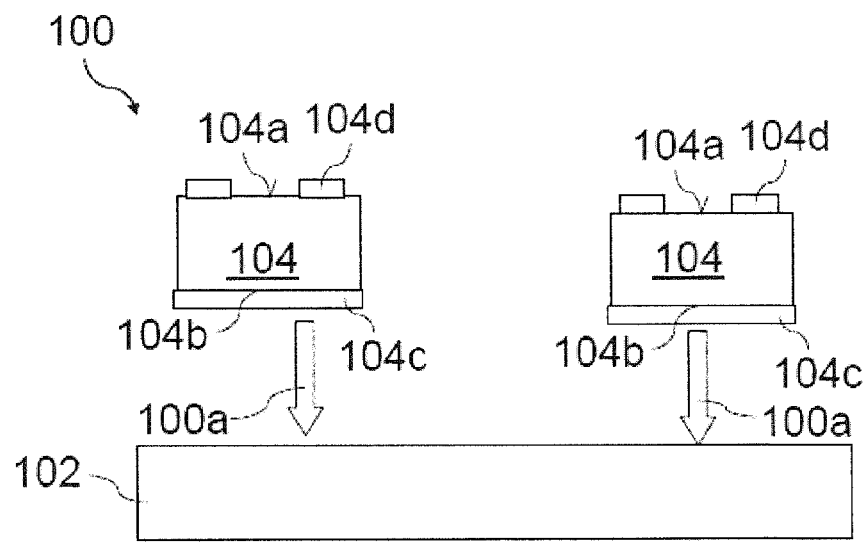
FIG. 1A to FIG. 1G illustrate a conventional method for manufacturing a chip arrangement.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. Various embodiments are described for structures or devices, and various embodiments are described for methods. It may be understood that one or more (e.g. all) embodiments described in connection with structures or devices may be equally applicable to the methods, and vice versa.

The word "exemplary" is used herein to mean "serving as an example, instance, or illustration". Any embodiment or design described herein as "exemplary" is not necessarily to be construed as preferred or advantageous over other embodiments or designs.

The word "over", used herein to describe forming a feature, e.g. a layer "over" a side or surface, may be used to mean that the feature, e.g. the layer, may be formed "directly on", e.g. in direct contact with, the implied side or surface. The word "over", used herein to describe forming a feature, e.g. a layer "over" a side or surface, may be used to mean that the feature, e.g. the layer, may be formed "indirectly on" the implied side or surface with one or more additional layers being arranged between the implied side or surface and the formed layer.

In like manner, the word "cover", used herein to describe a feature disposed over another, e.g. a layer "covering" a side or surface, may be used to mean that the feature, e.g. the layer, may be disposed over, and in direct contact with, the implied side or surface. The word "cover", used herein to describe a feature disposed over another, e.g. a layer "covering" a side or surface, may be used to mean that the feature, e.g. the layer, may be disposed over, and in indirect contact with, the implied side or surface with one or more additional layers being arranged between the implied side or surface and the covering layer.

The terms "coupled" and/or "electrically coupled" and/or "connected" and/or "electrically connected", used herein to describe a feature being connected to at least one other implied feature, are not meant to mean that the feature and the at least one other implied feature must be directly coupled or connected together; intervening features may be provided between the feature and at least one other implied feature.

Directional terminology, such as e.g. "upper", "lower", "top", "bottom", "left-hand", "right-hand", etc., may be used with reference to the orientation of figure(s) being described. Because components of the figure(s) may be positioned in a number of different orientations, the directional terminology is used for purposes of illustration and is in no way limiting. It is to be understood that structural or logical changes may be made without departing from the scope of the invention.

Modern chip (or die) arrangements, e.g. chip (or die) packages, may exhibit thin planar packaging, which may enable 3D stacking. Embedded chip (or die) packages may be especially useful in this respect. Manufacturing a chip (or die) arrangement may require forming an electrically conductive connection between a core layer (e.g. a metal core layer, for example a leadframe) and the chip (or die). Manufacturing a chip (or die) arrangement may additionally require forming an electrically conductive connection between the core layer and at least one passive component (e.g. a capacitor, resistor, and/or inductor).

FIG. 1A to FIG. 1G illustrate a conventional method for manufacturing a chip arrangement.

FIG. 1A shows cross-sectional view 100 of a chip arrangement including a leadframe 102 and a chip 104 (or die). The chip 104 (or die) may include a front-side 104a and a back-side 104b. A metallization layer 104c may be formed at the back-side 104b of the chip 104 and at least one contact 104d (e.g. a bonding pad) may be formed at the front-side 104a of the chip 104. The chip 104 may be bonded to the leadframe 102 by means of a bonding process (indicated by arrows 100a), which may be performed at a temperature in the range from about 200° C. to about 350° C.

Figure 1B:
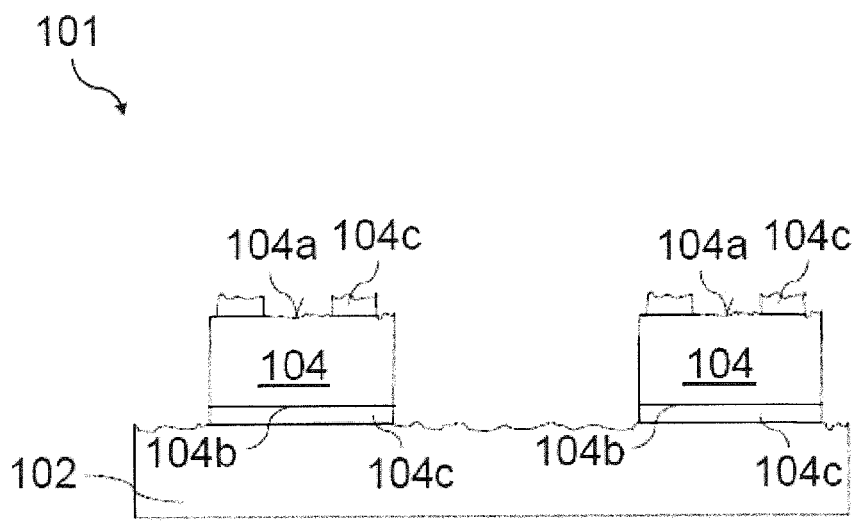

As shown in FIG. 1B in a view 101, a surface of the leadframe 102 (e.g. copper leadframe) may be roughened (e.g. by means of a micro-etching process) in order to, for example, promote adhesion of subsequent layers that may be formed over the chip 104 and/or the leadframe 102.

Figure 1C:
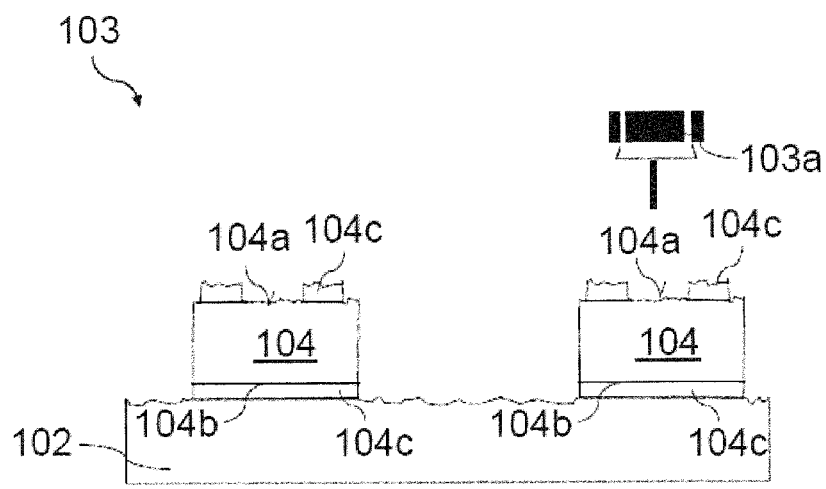

As shown in FIG. 1C in a view 103, the chip 104 may be inspected (e.g. optically inspected) to measure and/or calculate a relative spatial shift between adjacent chips 104 (or dies) bonded to the leadframe 102. For example, the chip 104 on the left and the chip 104 on the right may be inspected (e.g. optically inspected) by an apparatus 103a, and a relative position between the left chip 104 and the right chip 104 may be calculated.

Figure 1D:
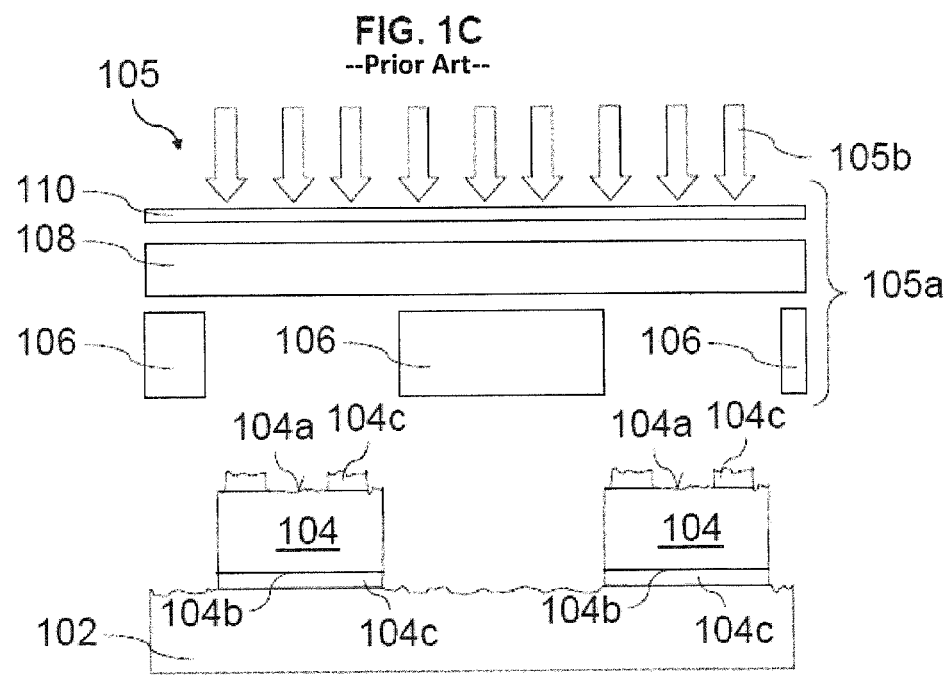

As shown in FIG. 1D in a view 105, a layup 105a may be formed over the chip 104 and the leadframe 102. The layup 105a may include a structured prepreg layer 106, an insulating layer 108 (e.g. a resin and/or an uncured prepreg) and a conductive layer 110. The structured prepreg layer 106 may be disposed over (e.g. disposed directly over) the leadframe 102. The structured prepreg layer 106 may be configured to occupy a gap between adjacent chips 104 bonded to the leadframe 102. For example, as shown in FIG. 1D, the structured prepreg layer 106 may occupy the gap between the chip 104 on the left and the chip 104 on the right. Additionally, the structured prepreg layer 106 may be configured to occupy a gap between a chip 104 and an edge of a leadframe 102, as shown in FIG. 1D. The insulating layer 108 may be disposed over the structured prepreg layer 106, and the conductive layer 110 may be disposed over the insulating layer 108, as shown in FIG. 1D.

Heat and/or pressure (indicated by arrow 105b) may be applied to the layup 105a and the leadframe 102 to bond (e.g. by lamination) the structured prepreg 106, the insulating layer (e.g. a resin) 108 and the conductive layer 110 to the leadframe 102 and the chip 104. Bonding the layup 105a (e.g. by lamination) may be performed over a plurality of leadframes 102 at one time. For example, in BLADE production, eight leadframes 102 may be laminated at one time, and each leadframe may be connected to another leadframe by means of a stencil that may be included in the layup 105a.

Figure 1E:
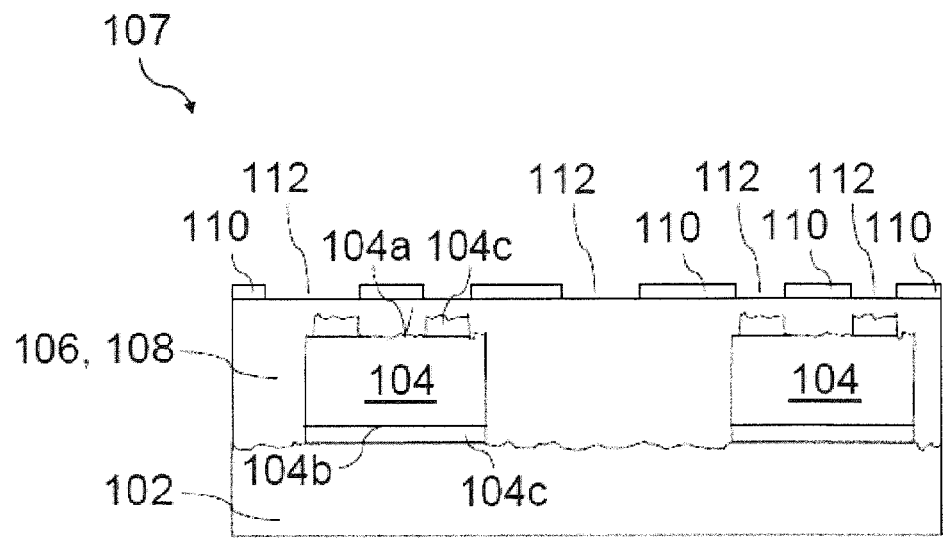

As shown in FIG. 1E in a view 107, vias 112 may be formed in the conductive layer 110 (e.g. by means of an etching process).

Figure 1F:
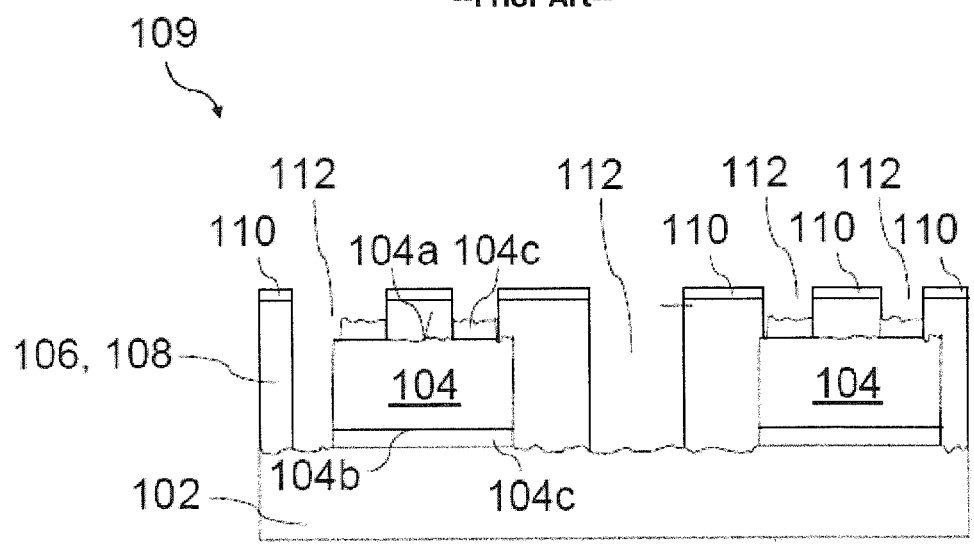

As shown in FIG. 1F in a view 109, the vias 112 may be extended to expose a part of the leadframe 102 and/or a part of the chip 104. For example, as shown in FIG. 1F, the vias 112 may be extended to expose at least one contact 104c (e.g. a bonding pad) of the chip 104. The vias 112 may be extended by means of a drilling process, for example a laser drilling process.

Figure 1G:
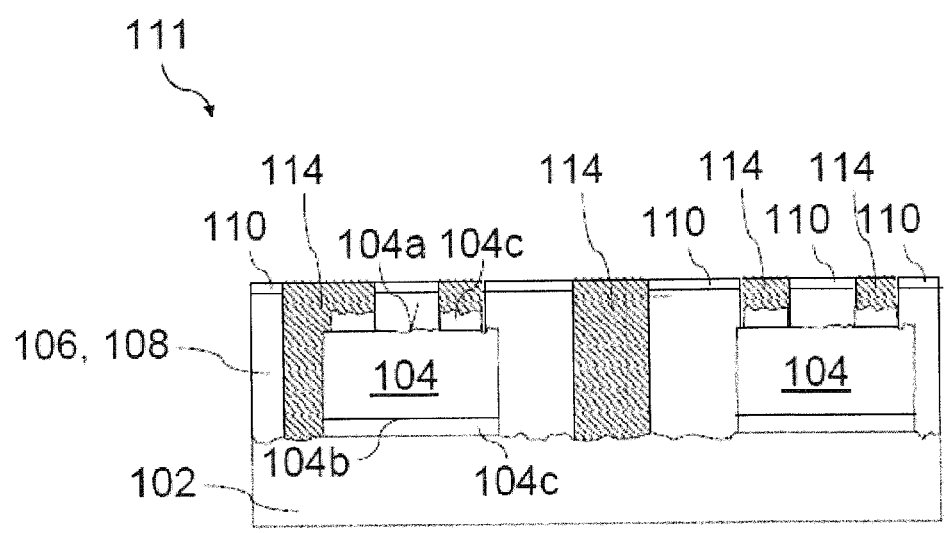

As shown in FIG. 1G in a view 111, the vias may be filled with a conductive material 114 (e.g. copper or copper alloy or any other suitable metal or metal alloy such as e.g. tungsten). The conductive material 114 may subsequently be structured (e.g. patterned), for example by means of etching.

The conventional method for manufacturing a chip arrangement shown in FIG. 1A to FIG. 1G may suffer undesirable effects. For example, bonding the chip 104 to the leadframe 102 (e.g. a thick copper layer), for example as shown in FIG. 1A, may be performed at high temperatures (e.g. in the range from about 200° C. to about 350° C.).

High bonding temperatures may cause warpage of the leadframe 102. Whilst it may be noted that a thicker leadframe 102 may reduce warpage caused by the high bonding temperatures, use of a thicker leadframe 102 may lead to a higher bill-of-materials (BOM).

High bonding temperatures may result in a coefficient-of-thermal-expansion (CTE) mismatch between the chip 104 and the leadframe 102. Accordingly, the chip arrangement manufactured using the method shown in FIG. 1A to FIG. 1G may suffer from high residual stress, which may affect the performance of the chip arrangement.

High bonding temperatures may also result in a high risk of failure caused by copper silicides that may be produced during the bonding process.

In addition to high bonding temperatures causing the above-mentioned undesirable effects in the chip arrangement, the leadframe 102, upon which the chip 104 is bonded to, may have a small size (e.g. about 165×68 mm$^2$) As described above, a plurality of leadframes 102 may be connected to each other with stencil (e.g. additional PCB stencil) which may be included in the layup 105a. This may lead to a complex layup structure, and a complex leadframe structure. The complex structure may result in poor aligning accuracy between the plurality of leadframes and may suffer from nonlinear dimension changes. For example, small changes in the dimension of a leadframe 102 and/or a chip 104 may lead to disproportionate changes in the dimensions of the stencil and/or layup 105 that may be formed over a plurality of leadframes 102.

Furthermore, since the chips 104 (or dies) are bonded on a substantially planar surface of the leadframe 102, opening for the chips 104 may need to be manufactured to the layup 105a. For example, the structured prepreg 106 shown in FIG. 1D which is laminated on the top of the leadframes 102 and chips 104 may form an opening for the chips 104. Accordingly, expensive prestructuring of materials (e.g. prepreg 106 and/or conductive layers 110 and/or stencil in layup 105a) may be required even before a lamination is formed.

In one or more embodiments, a method for manufacturing a chip arrangement may be provided.

An effect of one or more embodiments may be accurate alignment of a chip on a panel and/or provision of a simple lamination layup.

An effect of one or more embodiments may be prevention or substantial reduction of the formation of compounds (e.g. copper silicides) that may damage a chip.

An effect of one or more embodiments may be prevention or substantial reduction of CTE mismatch and/or high residual stress.

An effect of one or more embodiments may be removal of a need for structuring and/or patterning a prepreg used in lamination.

An effect of one or more embodiments may be the need for only one insulating layer used in lamination.

An effect of one or more embodiments may be cost savings in a bill-of-materials (BOM).

An effect of one or more embodiments may be manufacture of an interconnection (e.g. metallurgical interconnection) between a chip and a metal structure 302 in relatively low temperature.

An effect of one or more embodiments may be prevention or substantial reduction of warpage in a metal structure and/or a chip.

An effect of one or more embodiments may be the use of simple PCB (printed circuit board) manufacturing processes to manufacture a chip (or die) arrangement.

Figure 2:
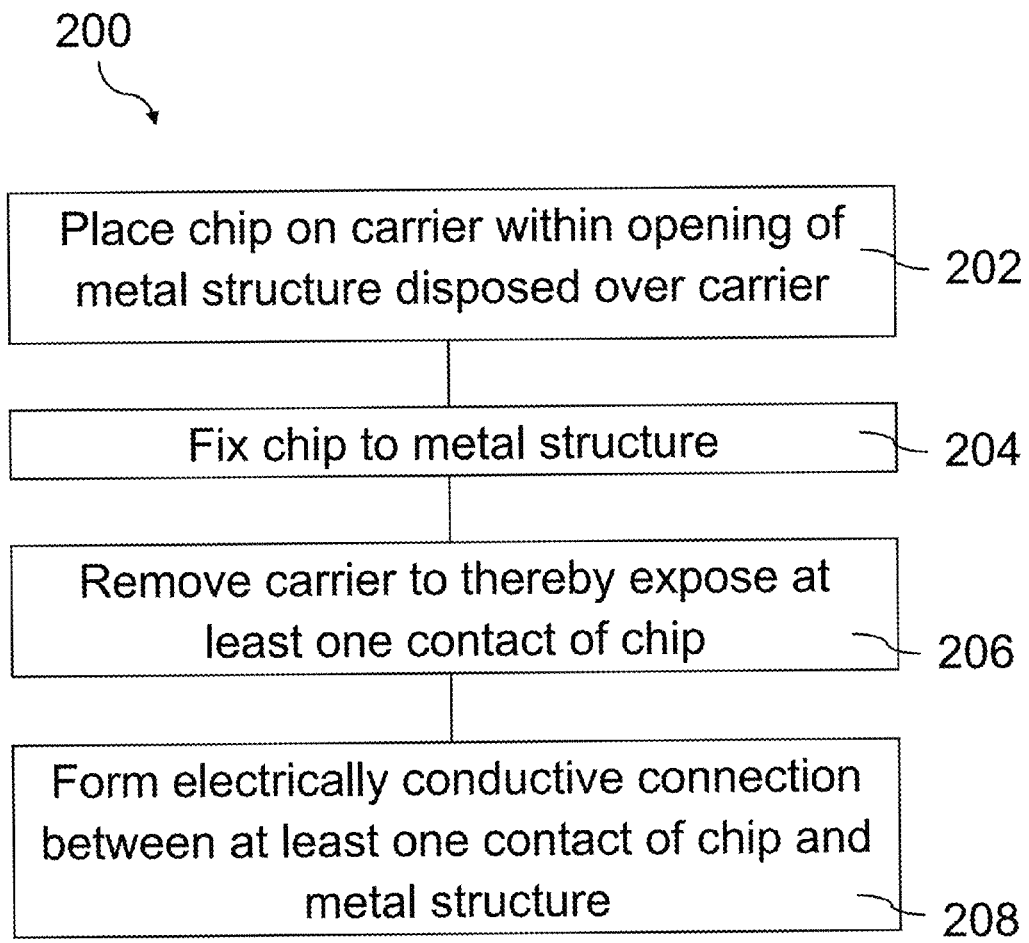
FIG. 2 shows a method for manufacturing a chip arrangement according to various embodiments.

FIG. 2 shows a method for manufacturing a chip arrangement according to various embodiments.

In one or more embodiments, the method may be used to manufacture a chip (or die) arrangement, for example, an embedded chip (or die) arrangement.

As shown in FIG. 2, the method 200 for manufacturing the chip arrangement may include: placing a chip on a carrier within an opening of a metal structure disposed over the carrier (in 202); fixing the chip to the metal structure (in 204); removing the carrier to thereby expose at least one contact of the chip (in 206); and forming an electrically conductive connection between the at least one contact of the chip and the metal structure (in 208).

Figure 3A:
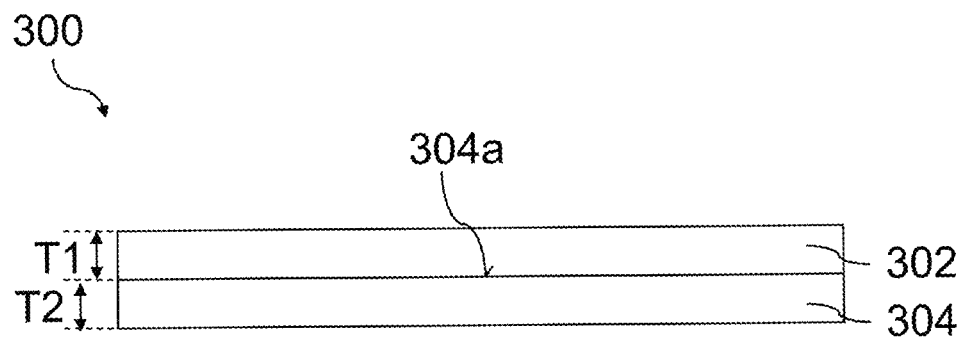
FIG. 3A to FIG. 3O show various views illustrating a method for manufacturing a chip arrangement according to various embodiments.
Figure 3B:
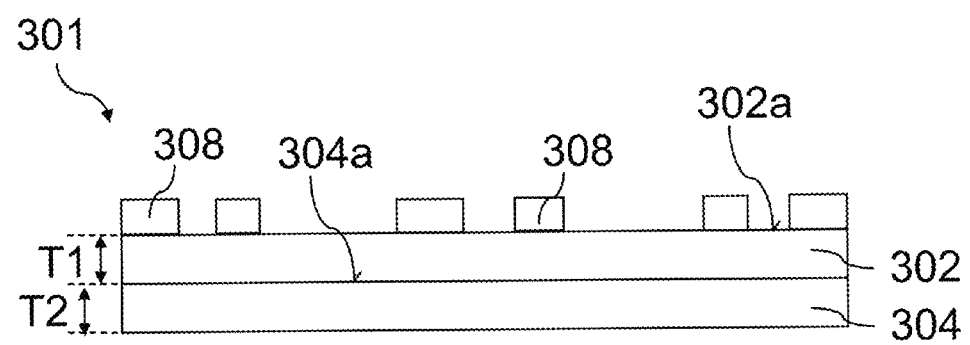
Figure 3C:
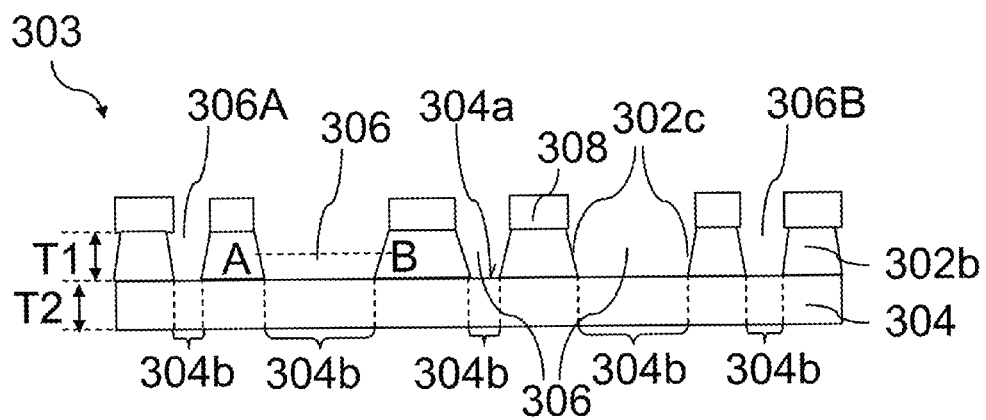
Figure 3D:
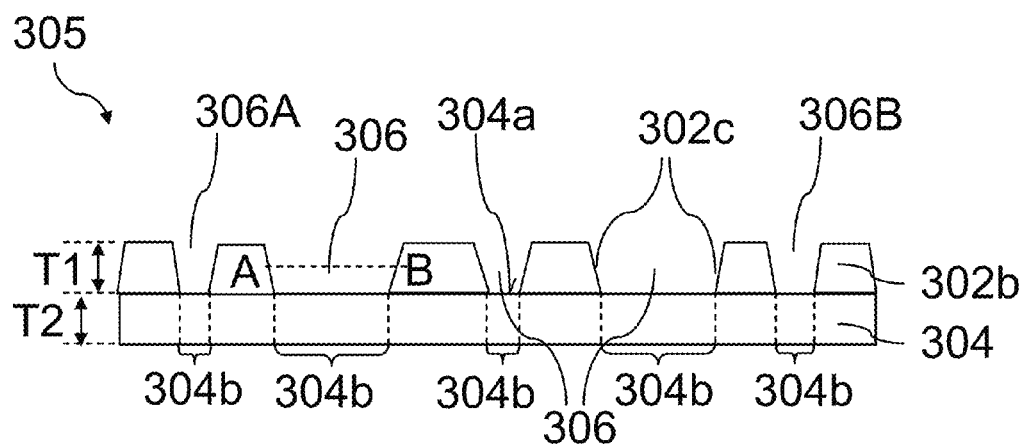
Figure 3E:
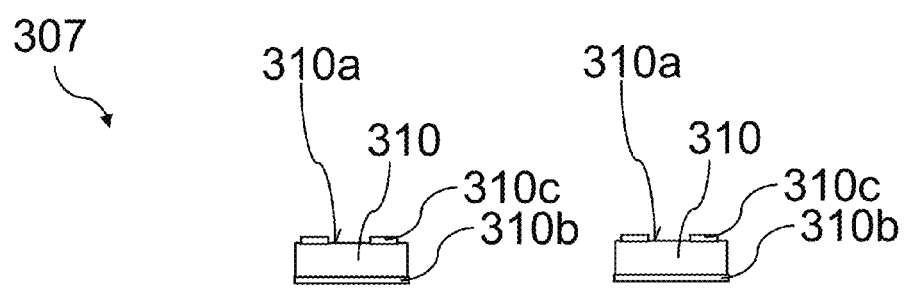
Figure 3E:
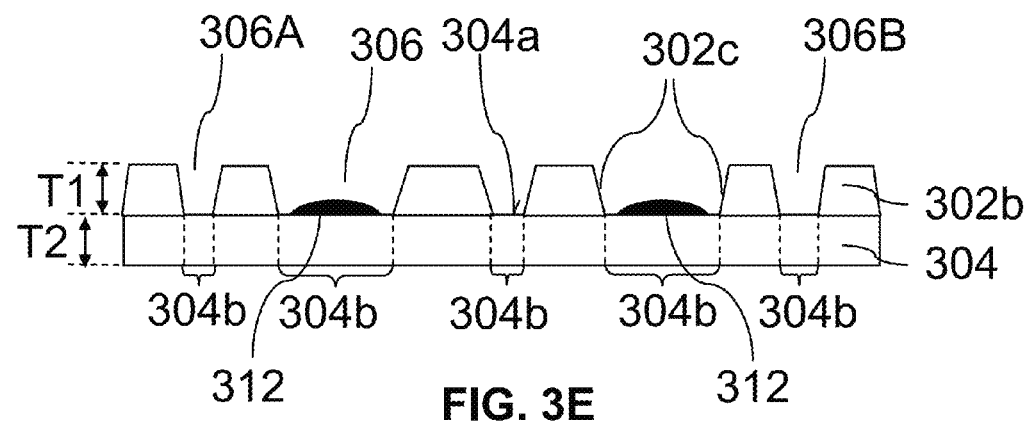
Figure 3F:
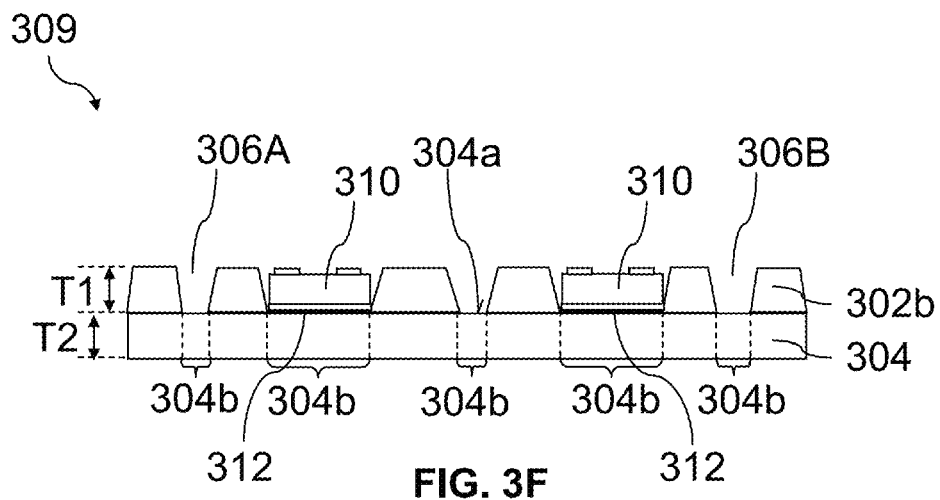
Figure 3G:
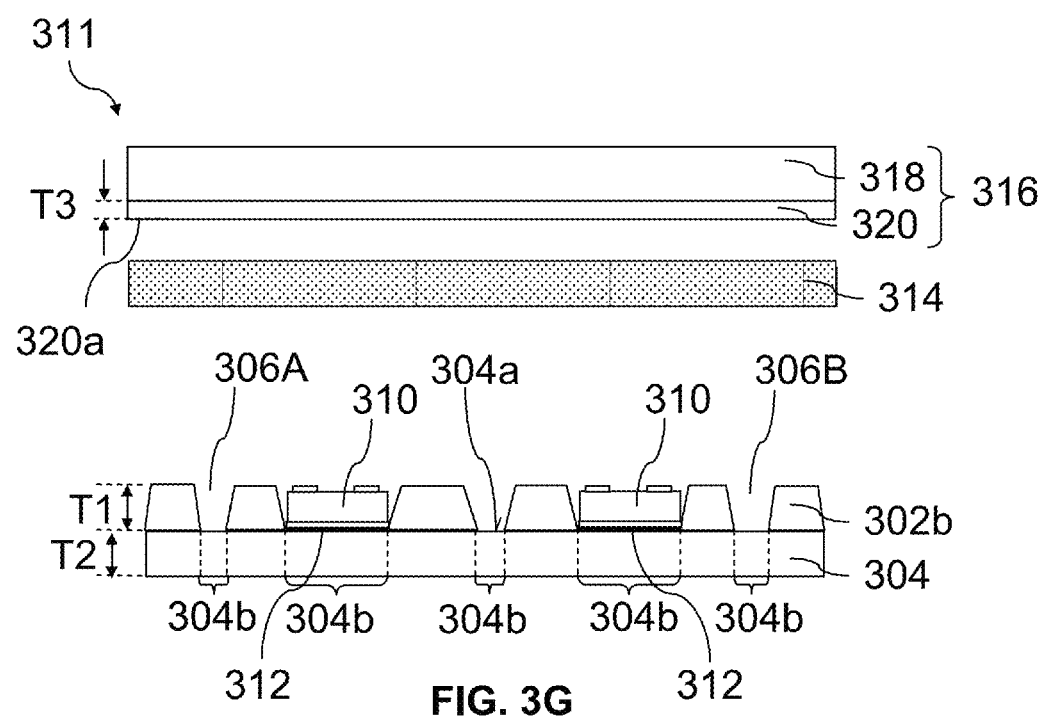
Figure 3H:
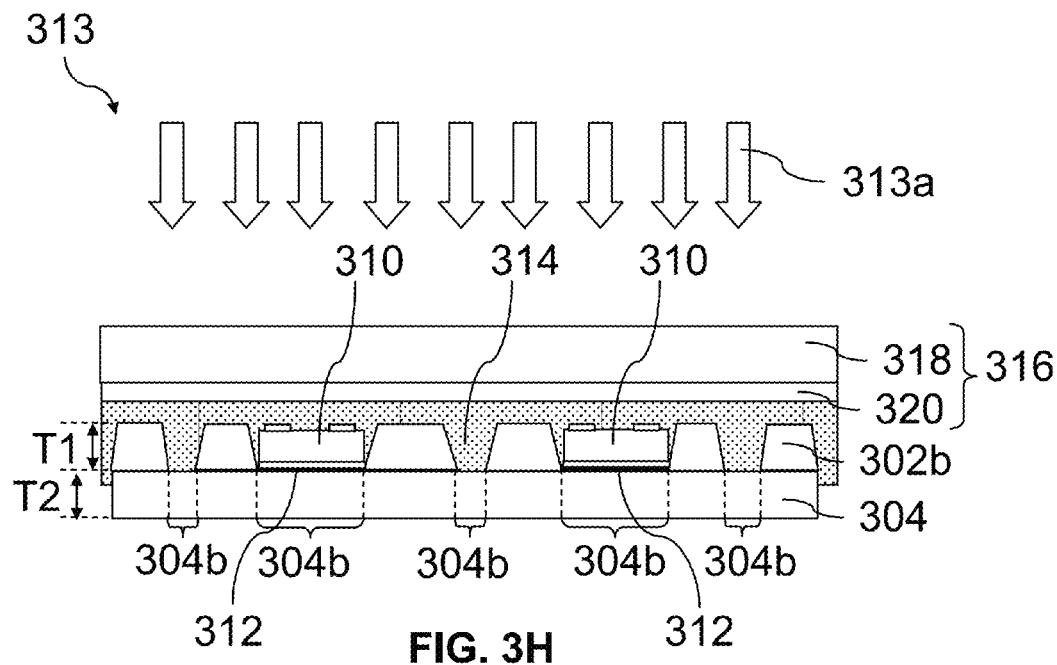
Figure 3I:
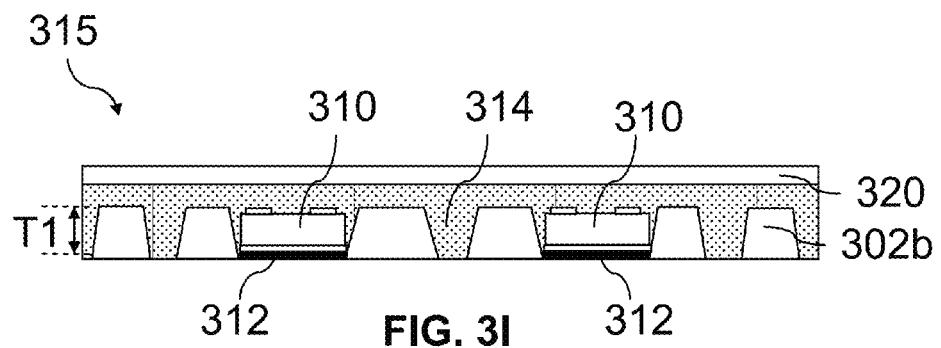
Figure 3J:
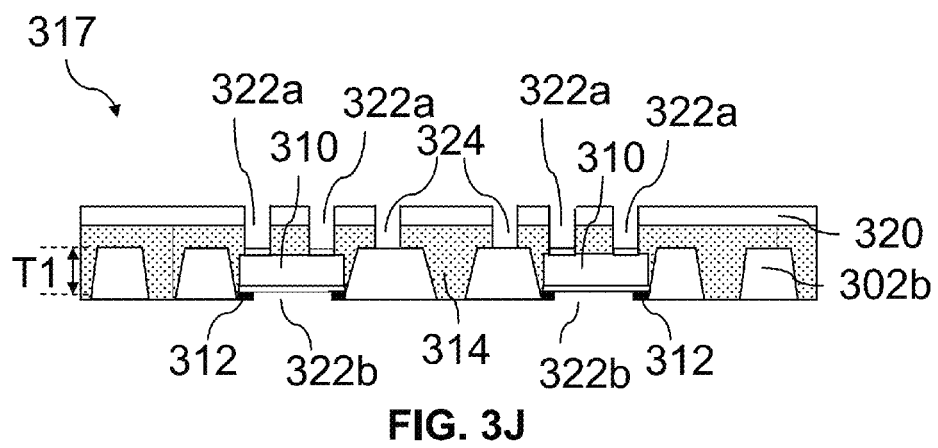
Figure 3K:
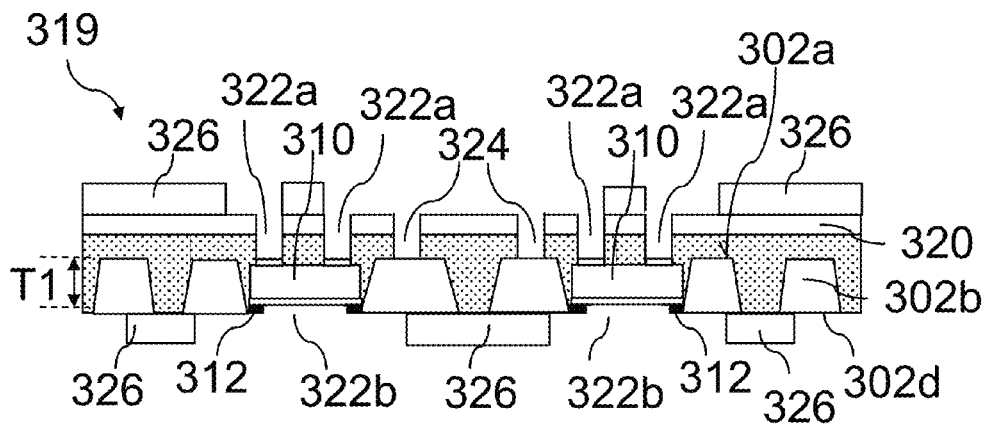
Figure 3L:
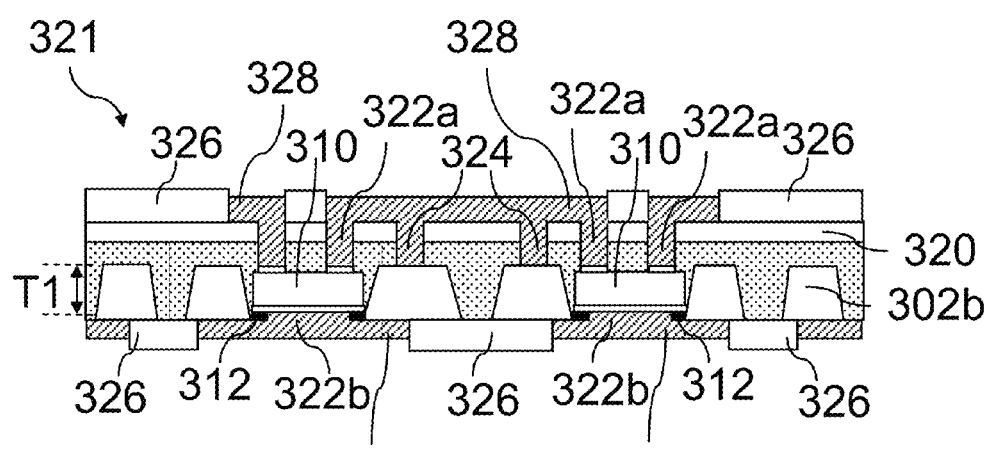
Figure 3M:
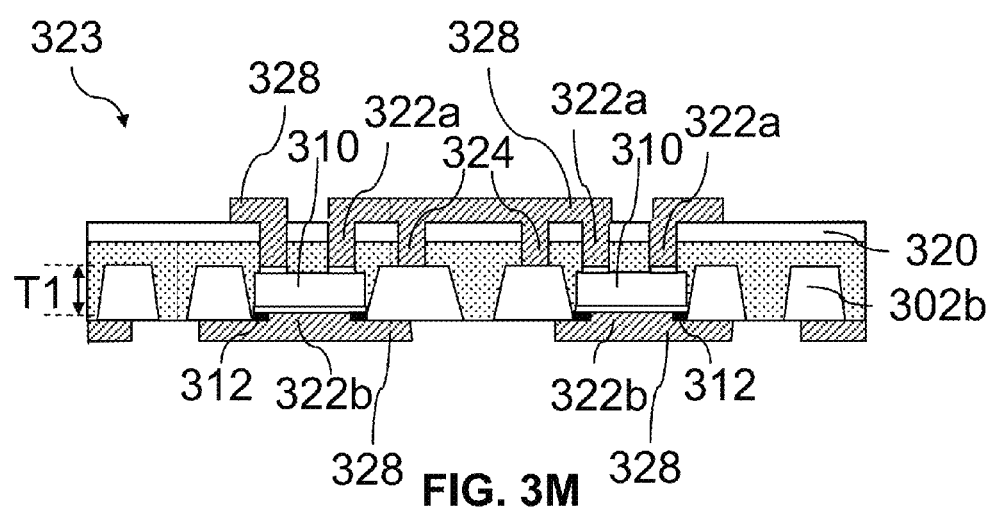
Figure 3N:
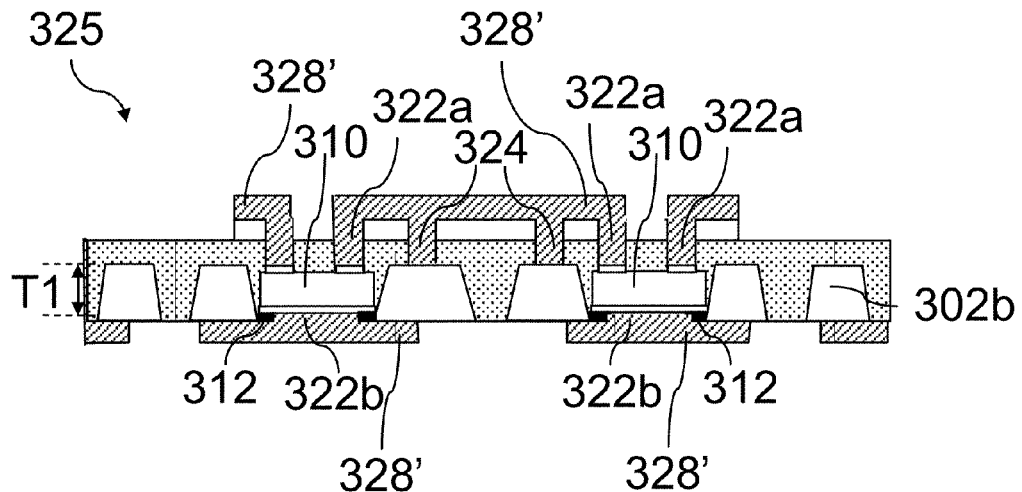
Figure 3O:
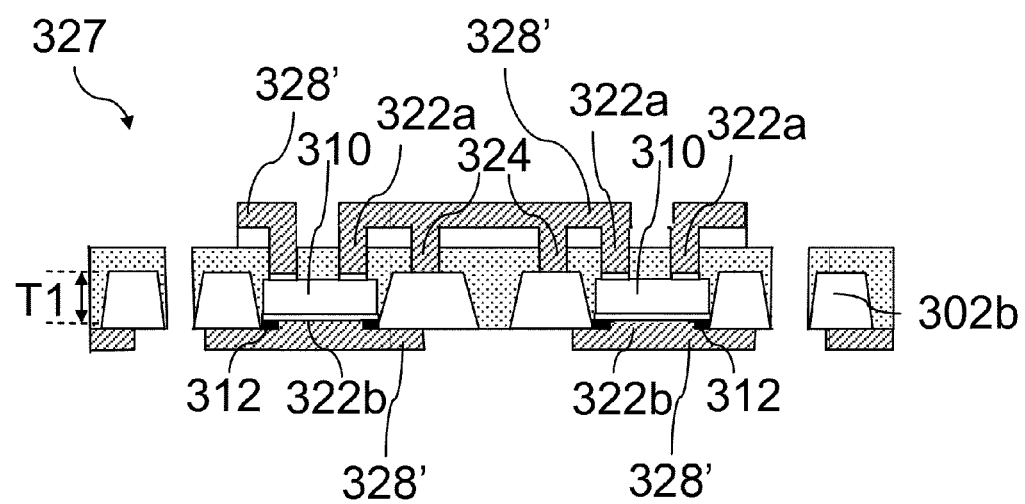

FIG. 3A to FIG. 3O show various cross-sectional views illustrating a method for manufacturing a chip (or die) arrangement according to various embodiments.

FIG. 3A shows a cross-sectional view 300 of a metal structure 302 disposed over a surface 304a of a carrier 304.

In one or more embodiments, the metal structure 302 may be a metal core layer of a chip (or die) package (e.g. an embedded chip package). The metal structure 302 may, for example, provide an electrical and/or thermal contact to a chip (or die) of the chip (or die) arrangement (e.g. in an embedded chip package).

In one or more embodiments, the metal structure 302 may include, or may consist of, a metal or metal alloy. In one or more embodiments, the metal may include at least one metal selected from a group of metals, the group consisting of: copper, aluminum, nickel or an alloy containing at least one of the aforementioned metals. For example, the metal structure 302 may include, or may be, a copper core layer of a chip (or die) package.

In one or more embodiments, the metal structure 302 may include, or may consist of, a material that may be plated by means of, for example, a plating process. For example, in one or more embodiments, the metal structure 302 may include, or may consist of copper.

In one or more embodiments, the metal structure 302 may include, or may consist of, a multi-layer structure. In one or more embodiments, the multi-layer structure may include at least one layer including, or consisting of, copper, aluminum, or nickel. For example, the metal structure 302 may be a multi-layer structure (e.g. a metal stack) including a copper layer.

In one or more embodiments, the metal structure 302 may include, or may consist of, a material that may have a thermal conductivity of greater than or equal to about 145 W/m/K, for example greater than or equal to about 148 W/m/K, for example greater than or equal to about 160 W/m/K, for example greater than or equal to about 200 W/m/K, although other values may be possible as well in accordance with other embodiments.

In one or more embodiments, the metal structure 302 may be a thick metal layer, which may be at least a part of a thick metal core layer of a chip (or die) package (e.g. an embedded chip package). In one or more embodiments, a thickness T1 of the metal structure 302 may be greater than or equal to about 30 μm, for example greater than or equal to about 50 μm, for example in the range from about 50 μm to about 100 μm, for example in the range from about 60 μm to about 90 μm, for example about 80 μm, although other values may be possible as well in accordance with other embodiments.

In one or more embodiments, the carrier 304 may include, or may consist of, a metal or metal alloy. In one or more embodiments, the metal may include at least one metal selected from a group of metals, the group consisting of: aluminum, iron, or an alloy containing at least one of the aforementioned metals. For example, the carrier 304 may include, or may consist of, an alloy made by combining iron and at least one other element (e.g. carbon). For example, the carrier 304 may include, or may consist of, steel.

In one or more embodiments, the carrier 304 may include, or may consist of, a metal layer (e.g. a copper layer) having a coating (e.g. a coated layer) interposed between the metal layer and the metal structure 302.

In one or more embodiments, a thickness T2 of the carrier 304 may be greater than about 40 μm, for example in the range from about 40 μm to about 200 μm, for example in the range from about 60 μm to about 150 μm, for example in the range from about 80 μm to about 120 μm, for example about 100 μm, although other values may be possible as well in accordance with other embodiments.

In one or more embodiments, the carrier 304 may, for example, be a layer (e.g. a temporary layer) upon which the metal structure 302 may be subsequently structured and/or shaped. Accordingly, in one or more embodiments, the metal structure 302 may include, or may consist of, a material that may be selectively etchable to a material of the carrier 304. For example, the material of the metal structure 302 may be removed by means of an etching process (e.g. a wet etching process and/or a dry etching process, for example a plasma etching process), which may leave the material of the carrier 304 at least substantially unperturbed and/or unremoved. By way of another example, the material of the carrier 304 may be removed by means of another etching process (e.g. another wet etching process and/or another dry etching process, for example another plasma etching process), which may leave the material of the metal structure 302 at least substantially unperturbed and/or unremoved.

In one or more embodiments, the metal structure 302 disposed over the surface 304a of the carrier 304 may be a panel, for example a foil (e.g. a conductive foil), that may be available commercially (e.g. a foil available from Metfoils AB). For example, the metal structure 302 disposed over the surface 304a of the carrier 304 may be a panel measuring about 300×400 mm² that may be commonly used as a PCB (printed circuit board) material.

In one or more embodiments, manufacturing the chip (or die) arrangement may include structuring the metal structure 302 using, for example, the carrier 304 as a layer upon which such a structuring is performed. For example, in one or more embodiments, manufacturing the chip (or die) arrangement may include forming an opening in a part of the metal structure 302 to expose a part of the surface 304a (e.g. an upper surface) of the carrier 304.

FIG. 3B and FIG. 3C show cross-sectional views 301 and 303 of an opening 306 (shown in FIG. 3C) formed in a part of the metal structure 302 to expose a part 304b of the surface 304a (e.g. an upper surface) of the carrier 304.

Only five openings 306 are shown in FIG. 3C, however it may be understood that the number of openings 306 may, for example, be one, two, three, four, six, seven, eight, nine, tens, hundreds of, or even more, openings in some embodiments.

As shown in FIG. 3B in a view 301, forming the opening 306 (shown in FIG. 3C) in a part of the metal structure 302 may include forming an etch mask 308 over a surface 302a (e.g. an upper surface) of the metal structure 302. The surface 302a of the metal structure 302 may be a surface of the metal structure 302 remote from (e.g. facing away from) the carrier 304.

In one or more embodiments, the etch mask 308 may be formed over the surface 302a (e.g. an upper surface) of the metal structure 302 by depositing a resist material over the surface 302a of the metal structure 302, and patterning the resist material. In one or more embodiments, patterning the resist material may include, or may consist of, a lithographic process (e.g. a photo-lithographic process).

In one or more embodiments, the etch mask 308 may be formed over the surface 302a (e.g. an upper surface) of the metal structure 302 by plating a metal layer or metal alloy layer over the surface 302a of the metal structure 302, and patterning (e.g. by means of etching) the metal layer or metal alloy layer plated over the surface 302a of the metal structure 302. For example, the etch mask 308 may be formed by plating tin over the surface 302a of the metal structure 302 to form a tin layer, and patterning the tin layer (e.g. by etching a part of the tin layer) to form the etch mask 308.

As shown in FIG. 3C in a view 303, forming the opening 306 in a part of the metal structure 302 may include removing a part of the metal structure 302 to expose the part 304b of the surface 304a (e.g. an upper surface) of the carrier 304. In one or more embodiments, removing a part of the metal structure 302 to form the opening 306 may leave behind a part 302b of the metal structure 302 which may, for example, include at least one sidewall 302c. The at least one sidewall 302c may, for example, form the sidewalls 302c of the opening 306. The part 302b of the metal structure 302 may, for example, be a core layer of a chip arrangement (e.g. a chip package).

In one or more embodiments, the opening 306 may be formed in a part of the metal structure 302 by means of an etching process. As described above, the metal structure 302 may include, or may consist of, a material that may be selectively etchable to a material of the carrier 304. Therefore, the etching process used to formed the opening 306 may, for example, be a selective etching process. The opening 306 may be formed by etching part of the metal structure 302 using the etch mask 308 as a mask. In one or more embodiments, the etch mask 308 may be removed from the surface 302a of the metal structure 302 after forming the opening 306.

In one or more embodiments, the etching process may include, or may be, at least one of a wet etch process and a dry etch process (e.g. a plasma etch process, for example, a Bosch etch process), or other suitable etching processes.

In one or more embodiments, the opening 306 formed in the metal structure 302 may include at least one of a hole (e.g. a through-hole), a dicing street, a via (e.g. a micro-via and/or a through-via), a deepening, a cavity, and a trench, although other types of openings may be possible as well in accordance with other embodiments. For example, the openings 306A and 306B may be dicing streets formed in the metal structure 302.

In accordance with an embodiment, a cross-section of the opening 306 along a plane A-B shown in FIG. 3C may, for example, have a circular shape, a rectangular shape, a triangular shape, an oval shape, a quadratic shape, a polygonal shape, or an irregular shape, although other shapes may be possible as well in accordance with other embodiments.

In one or more embodiments, an aspect of the method illustrated in FIG. 3A to FIG. 3C may be that a metal core layer (e.g. a copper core layer) may be manufactured (e.g. patterned) above a carrier.

In one or more embodiments, an effect of the method illustrated in FIG. 3A to FIG. 3C may be provision of a relatively high amount of metal (e.g. copper) (e.g. in the metal structure 302) for use in the chip (or die) arrangement, which may achieve good electrical and thermal behavior.

In one or more embodiments, an aspect of the method illustrated in FIG. 3A to FIG. 3C may be that only one panel including the carrier 304 and the metal structure 302 may be needed to manufacture the chip arrangement (e.g. an embedded chip package) instead of a plurality of leadframes 102 and a stencil included in the layup 105a to connect the plurality of leadframes 102 together as in FIG. 1D. Therefore, an effect of the method illustrated in FIG. 3A to FIG. 3C may be cost savings in a bill-of-materials (BOM). An effect of the method illustrated in FIG. 3A to FIG. 3C may be formation of a core layer (e.g. the part 302b of the metal structure 302) by means of less process steps than the conventional method for manufacturing a chip arrangement shown in FIG. 1A to 1G.

In one or more embodiments, an effect of the method illustrated in FIG. 3A to FIG. 3C may be removal of material (e.g. copper) from a part of the metal structure 302 which may, for example subsequently be a dicing street (e.g. openings 306A and 306B).

In one or more embodiments, an aspect of the method illustrated in FIG. 3A to FIG. 3C may be that a large panel size (e.g. a panel measuring about 300×400 mm$^2$ or larger, for example about 500×600 mm$^2$ or larger, although other values may be possible as well in accordance with other embodiments) may be used instead of the leadframe 102 shown in FIG. 1A to FIG. 1H which may, for example, be smaller (e.g. about 165×68 mm$^2$) Therefore, an effect of the method illustrated in FIG. 3A to FIG. 3C may be accurate alignment of a chip on the panel (shown in FIG. 3E and FIG. 3F). Furthermore, since a plurality of leadframes 102 may not be needed as in FIG. 1A to FIG. 1H, an effect of the method illustrated in FIG. 3A to FIG. 3C may be provision of a simple layup (shown in FIG. 3G and FIG. 3H).

In one or more embodiments, manufacturing the chip (or die) arrangement may include roughening the metal structure 302b and the part 304b of the surface 304a of the carrier 304 that is exposed. Roughening the metal structure 302b may, for example, form an uneven surface at the surface 302a (e.g. an upper surface) and/or sidewalls 302c of the metal structure 302b. In like manner, roughening the part 304b of the surface 304a of the carrier 304 that is exposed may, for example, form an uneven surface at the the part 304b of the surface 304a of the carrier 304. Roughening may, for example, enhance adhesion of subsequent material that may be formed over (e.g. deposited over and/or pressed onto) the surface 302a (e.g. an upper surface) and/or sidewalls 302c of the metal structure 302b and/or the part 304b of the surface 304a of the carrier 304.

FIG. 3D shows a view 305 in which an uneven surface is formed at the surface 302a (e.g. an upper surface) and sidewalls 302c of the metal structure 302b as well as at the part 304b of the surface 304a of the carrier 304 that is exposed. In one or more embodiments, roughening the metal structure 302b and the part 304b of the surface 304a of the carrier 304 that is exposed may include an etching process (e.g. a microetching process).

The method illustrated in FIG. 3A to FIG. 3D may be used to form the opening 306 in part of the metal structure 302. Nonetheless, in another embodiment, the opening 306 in the metal structure 302 may be formed by means of a process other than an etching process, for example by means of a structured deposition process and/or a selective plating process. For example, the part 302b of the metal structure 302 (e.g copper) may be selectively deposited and/or selectively plated over the carrier 304 (e.g. an aluminum or steel carrier) such that the part 304b of the surface 304a (e.g. an upper surface) of the carrier 304 is left exposed. Such a process may result in an arrangement similar, or identical, to the arrangement shown in FIG. 3D. For example, a patterned resist material (e.g. a photo-resist material) may be formed over the part 304b of the surface 304a of the carrier 304, and the metal structure 302 may be formed (e.g. by means of selective deposition and/or selective plating) over a part of the surface 304a of the carrier 304 that may be free from the patterned resist material. In other words, the metal structure 302 may be formed (e.g. by means of selective deposition and/or selective plating) over a part of the surface 304a of the carrier 304 that is not covered by the patterned resist material.

In one or more embodiments, manufacturing the chip (or die) arrangement may include disposing a chip (or die) within the opening 306 of the metal structure 302b, and over the part 304b of the surface 304a of the carrier 304 that is exposed.

FIG. 3E and FIG. 3F show cross-sectional views 307 and 309 where a chip 310 (or die) is disposed within the opening 306 of the metal structure 302b, and over the part 304b of the surface 304a of the carrier 304 that is exposed.

In one or more embodiments, the chip 310 may, for example, be a chip used for MEMS and/or logic and/or memory and/or power applications.

In one or more embodiments, the chip 310 may include at least one contact (e.g. an electrically conductive contact). In one or more embodiments, the at least one contact of the chip 310 may be disposed over at a front-side 310a of the chip 310. For example, the at least one contact of the chip may be an electrically conductive contact (e.g. a bonding pad 310c) disposed over the front-side 310a of the chip 310. In one or more embodiments, the at least one contact of the chip 310 may be disposed over a back-side 310b of the chip 310. For example, the at least one contact of the chip 310 may include, or may be, a metallization layer which may, for example, be disposed over the back-side 310b of the chip 310. The chip 310 shown in FIG. 3E may, for example, be a chip configured for use in power applications, and may, therefore, include at least one contact disposed over the front-side 310a and the back-side 310b of the chip 310.

As shown in FIG. 3E in the view 307, disposing the chip 310 (or die) within the opening 306 may include disposing (e.g. depositing and/or dispensing) an adhesive 312 over the part 304b of the surface 304a of the carrier 304 that is exposed. The adhesive 312 may, for example, be used to fix (e.g. temporarily fix) the chip 310 (or die) to the carrier 304 (e.g. aluminum carrier) in order that the chip 310 may be disposed within the opening 306.

In one or more embodiments, the adhesive 312 may include, or may consist of, a non-conductive material (e.g. a non-conductive paste). In one or more embodiments, the adhesive 312 may include, or may consist of, a dicing tape adhesive. In one or more embodiments, the adhesive 312 may include, or may consist of, at least one of a thermoplastic material (i.e. a material that may be pliable and/or moldable above a specific temperature, and which may return to a solid state upon cooling) and a thermosetting material (i.e. a material which forms an irreversible chemical bond during a curing process, which may break down upon melting, and which may not reform upon cooling).

As shown in FIG. 3F in the view 309, disposing the chip 310 (or die) within the opening 306 may further include disposing the chip 310 over the adhesive 312. As shown in FIG. 3F, the chip 310 (or die) may be disposed within the opening 306 such that the back-side 310b of the chip 310 faces the surface 304a of the carrier 304. In other words, the front-side 310a of the chip 310 may face away (i.e. may be remote from) the surface 304a of the carrier 304. In one or more embodiments, the back-side 310b of the chip 310 may be substantially flush (e.g. substantially planar) with a surface of the metal structure 302b facing the carrier 304 (e.g. the surface opposite the surface 302a of the metal structure 302.

In one or more embodiments, the adhesive 312 may attach the chip 310 to the carrier 304. For example, the adhesive 312 may attach the back-side 310b of the chip 310 to the part 304b of the surface 304a of the carrier 304 that is exposed.

In one or more embodiments, the adhesive 312 may need to be heated in order for the chip 310 to be attached (e.g. fixed) to the carrier 304 and within the opening 306. In one or more embodiments, disposing the chip 310 (or die) within the opening 306 may further include heating the adhesive 312 after disposing the chip 310 over the adhesive 312. In one or more embodiments, heating the adhesive 312 may include a curing process. The curing process may, for example, be carried out at a temperature in the range from about 100° C. to about 200° C., for example in the range from about 120° C. to about 150° C., for example, in the range from about 130° C. to about 140° C.

In one or more embodiments, the adhesive 312 may be heated using the chip 310 (or die). For example, in one or more embodiments, the chip 310 (or die) may be heated prior to disposing the chip 310 (or die) within the opening 306. For example, the chip 310 (or die) shown in FIG. 3E may be heated (e.g. to a temperature in the range from about 100° C. to about 200° C.), and the heated chip 310 (or die) may be disposed within the opening 306, thereby curing the adhesive 312.

In one or more embodiments, an aspect of the method illustrated in FIG. 3E and FIG. 3F may be that the chip 310 is bonded to the carrier 304 at relatively low temperatures.

In one or more embodiments, an effect of the method illustrated in FIG. 3E and FIG. 3F may be prevention or substantial reduction of the formation of compounds (e.g. copper silicides) that may damage the chip 310.

In one or more embodiments, an effect of the method illustrated in FIG. 3A to FIG. 3F may be avoidance of CTE mismatch and/or high residual stress.

The method illustrated in FIG. 3A to FIG. 3F may be used to place the chip 310 on the carrier 304 within the opening 306 of the metal structure 302 disposed over the carrier 304. In other words, placing the chip 310 on the carrier 304 within the opening 306 of the metal structure 302 disposed over the carrier 304 may include providing the metal structure 302 disposed over the surface 304a of the carrier 304 (e.g. in FIG. 3A); forming the opening 306 in a part of the metal structure 302 to expose the part 304b of the surface 304a of the carrier 304 (e.g. in FIG. 3B to FIG. 3D); and disposing the chip 310 within the opening 306 of the metal structure 302, and over the part 304b of the surface 304a of the carrier 304 that is exposed (e.g. in FIG. 3E and FIG. 3F). In one or more embodiments, the method illustrated in FIG. 3A to FIG. 3F may correspond to "placing a chip on a carrier within an opening of a metal structure disposed over the carrier" (in 202) of method 200 shown in FIG. 2.

In one or more embodiments, manufacturing the chip (or die) arrangement may include fixing the chip 310 to the metal structure 302b. As described above in relation to FIG. 3E and FIG. 3F, the adhesive 312 may attach (e.g. fix), for example temporarily fix, the chip 310 to the carrier 304. Nonetheless the chip 310 (or die) may need to be attached (e.g. fixed) to the metal structure 302b. In one or more embodiments, fixing the chip 310 to the metal structure 302b may include forming a layer (e.g. an insulating layer) over the chip 310 and the metal structure 302b, wherein the layer (e.g. insulating layer) fills the opening 306 of the metal structure 302b.

FIG. 3G and FIG. 3H show cross-sectional views 311 and 313 where the chip 310 (or die) is fixed to the metal structure 302b.

As shown in FIG. 3G in the view 311, fixing the chip 310 to the metal structure 302b may include forming a layup over the chip 310, the metal structure 302b, and the carrier 304. The layup may include an insulating layer 314 and a conductive layer 316. In one or more embodiments, forming the layup may include placing the insulating layer 314 between the conductive layer 316 and the chip 310 disposed within the opening 306. Since a surface of the chip 310 (e.g. the backside 310b of the chip 310 in FIG. 3G) may be substantially flush with a surface of the metal structure 302b facing the carrier 304, the insulating layer 314 placed between the conductive layer 316 and the chip 310 is also positioned between the conductive layer 316 and the metal structure 302b.

In one or more embodiments, the insulating layer 314 may include, or may consist of, at least one material selected from a group of materials, the group consisting of: a prepreg material and a resin material. For example, the insulating layer 314 may include a resin film and/or a molding resin.

In one or more embodiments, the conductive layer 316 may include a second carrier 318 and a metal layer 320 disposed over the second carrier 318. As shown in FIG. 3G, a surface 320a of the metal layer 320 may face the insulating layer 314. In one or more embodiments, the conductive layer 316 may be a foil (e.g. a conductive foil) that may be available commercially (e.g. from Metfoils AB).

In one or more embodiments, the metal layer 320 may include, or may consist of, copper or a copper alloy. In one or more embodiments, a thickness T3 of the metal layer 320 may be in the range from about 5 μm to about 20 μm, for example in the range from about 5 μm to about 15 μm, for example about 9 μm, although other values may be possible as well in accordance with other embodiments.

In one or more embodiments, the metal layer 320 may be needed for forming subsequent electrical and/or thermal connections with the chip 310. For example, the metal layer 320 may be used or may be part of an electrical and/or thermal connection to the front-side 310a of the chip 310 (e.g. to the at least one bonding pad 310c of the chip 310).

In one or more embodiments, the second carrier 318 may include, or may consist of, a metal or metal alloy. In one or more embodiments, the metal may include at least one metal selected from a group of metals, the group consisting of: aluminum, iron, or an alloy containing at least one of the aforementioned metals. A thickness of the second carrier 318 may be greater than or equal to about 15 μm, for example greater than or equal to about 18 μm, for example greater than or equal to about 40 μm, for example in the range from about 40 μm to about 200 μm, for example in the range from about 60 μm to about 150 μm, for example in the range from about 80 μm to about 120 μm, for example about 100 μm, although other values may be possible as well in accordance with other embodiments.

As shown in FIG. 3H in the view 313, fixing the chip 310 to the metal structure 302b may include applying heat and pressure (indicated by arrows 313a) to fuse the conductive layer 316, the insulating layer 314, the chip 310, and the metal structure 302b together. In one or more embodiments, the heat and/or pressure applied may soften (e.g. melt) the insulating layer 314 such that the insulating layer 314 flows into and fills the opening 306 of the metal structure 302b. A volume of the insulating layer 314 used may cause the insulating layer 314 to be additionally disposed over the chip 310 and the metal structure 302b after the application of heat and/or pressure, as shown in FIG. 3H.

In one or more embodiments, fixing the chip 310 to the metal structure 302b may further include removing a part of the conductive layer 316 after fusing the metal layer 320, the insulating layer 314, the chip 310 and the metal structure 302b disposed over the carrier 304. As described above, the metal layer 320 may be needed for forming subsequent electrical and/or thermal connections with the chip 310. Therefore, removing the part of the conductive layer 316 may include removing the second carrier 318 from the metal layer 320. The metal layer 320 may remain and may be disposed over the insulating layer 314 after removal of the second carrier 318.

In one or more embodiments, an aspect of the method illustrated in FIG. 3G and FIG. 3H may be a simpler layup structure since the chip 310 is disposed within the opening 306.

In one or more embodiments, an effect of the method illustrated in FIG. 3G and FIG. 3H may be removal of a need for structuring and/or patterning the insulating layer 314 prior to the application of heat and/or pressure since the chip 310 is disposed within the opening 306. In contrast, the conventional method illustrated in FIG. 1D requires a structured prepreg 106 to be formed prior to lamination in order to create an opening for the chip 104. This may be a consequence of the chip 104 being disposed over a substantially planar surface of the leadframe 102.

In one or more embodiments, an effect of the method illustrated in FIG. 3G and FIG. 3H may be the need for only one insulating layer 314 (e.g. a prepreg and/or resin) to fill the opening 306. Therefore, an effect of the method illustrated in FIG. 3G and FIG. 3H may be cost savings in a bill-of-materials (BOM).

The method illustrated in FIG. 3G and FIG. 3H may be used to fix the chip 310 to the metal structure 302b. In other words, fixing the chip 310 to the metal structure 302b may include forming the insulating layer 314 over the chip 310 and the metal structure 302b, wherein the insulating layer 314 fills the opening 306 of the metal structure 302b. For example, fixing the chip 310 to the metal structure 302b may include placing the insulating layer 314 between the conductive layer 316 and the chip 310 and the metal structure 302b disposed over the carrier 304 (e.g. in FIG. 3G), and applying heat and/or pressure to fuse the conductive layer 316, the insulating layer 314 and the chip 310 and the metal structure 302b disposed over the carrier 304 (e.g. in FIG. 3H). In one or more embodiments, the method illustrated in FIG. 3G and FIG. 3H may correspond to fixing a chip on the metal structure (in 204) of method 200 shown in FIG. 2.

In one or more embodiments, manufacturing the chip (or die) arrangement may include exposing at least one contact of the chip 310 disposed within the opening 306 and covered by the insulating layer 314.

FIG. 3I and FIG. 3J show cross-sectional views 315 and 317 where at least one contact of the chip 310 is exposed.

In one or more embodiments, exposing at least one contact of the chip 310 may include removing the carrier 304 to thereby expose at least one contact of the chip 310.

As shown in FIG. 3I in the view 315, exposing at least one contact of the chip 310 may include removing the carrier 304. As described above, the metal structure 302 may include, or may consist of, a material that may be selectively etchable to a material of the carrier 304. Accordingly, in one or more embodiments, the carrier 304 may be removed by means of, for example, an etching process (e.g. a plasma etching process), which may leave the material of the metal structure 302 at least substantially unperturbed and/or unremoved.

In one or more embodiments, removing the carrier 304 may include peeling away the carrier 304. For example, as described above, the carrier 304 may include, or may consist of a metal layer (e.g. a copper layer) having a coating (e.g. a coated layer) interposed between the metal layer and the metal structure 302. In such an embodiment, the carrier 304 may, for example, be removed by means of peeling the metal layer and the coating from the metal structure 302.

As shown in FIG. 3J in the view 317, exposing at least one contact of the chip 310 may further include forming at least one second opening 322a, 322b to expose the at least one contact of the chip 310. The at least one second opening 322a, 322b may be required to form an electrically conductive connection between the at least one contact of the chip 310 and the metal structure 302b.

As described above, the chip 310 may, for example, be a chip used for MEMS and/or logic and/or memory and/or power applications. Therefore, in one or more embodiments, exposing at least one contact of the chip 310 may include forming at least one second opening 322a to expose at least one contact (e.g. the bonding pad 310c) disposed on the front-side 310a of the chip 310 (e.g. in a chip used for logic and/or memory). In like manner, in one or more embodiments, exposing at least one contact of the chip 310 may additionally include forming at least one second opening 322b to expose at least one contact (e.g. a metallization layer) disposed on the back-side 310b of the chip 310 (e.g. in a chip used for power applications).

For example, the chip 310 shown in FIG. 3J may be used for power applications. Accordingly, the chip 310 may require a current flow between its front-side 310a and its back-side 310b. Accordingly, the at least one second opening 322b may be formed to expose at least one contact (e.g. a metallization layer) disposed on the back-side 310b of the chip 310 and the at least one second opening 322a may be formed to expose at least one contact (e.g. the at least one bonding pad 310c) on the front-side 310a of the chip 310. Accordingly, in the arrangement shown in FIG. 3J, the at least one opening 322a, 322b may be formed in the insulating layer 314 (e.g. in respect of the at least one opening 322a) and in the adhesive 312 (e.g. in respect of the at least one opening 322b).

As shown in FIG. 3J, the at least one second opening 322b formed to expose at least one contact (e.g. a metallization layer) disposed on the back-side 310b of the chip 310 (e.g. in a chip used for power applications) may be formed such that a part of the adhesive 312 remains at an edge of the back side 310b of the chip 310. For example, the part of the adhesive 312 that remains at the edge of the chip 310 may form a sealing ring at a circumference of the back-side 310b of the chip 310 (as shown in FIG. 3J).

In one or more embodiments, the at least one second opening 322b formed to expose at least one contact (e.g. a metallization layer) disposed on the back-side 310b of the chip 310 (e.g. in a chip used for power applications) may be formed such that the adhesive 312 is removed from the entire back-side 310b of the chip 310. In other words, the at least one second opening 322b may be formed such that the back-side 310b of the chip 310 is free from the adhesive 312. In one or more embodiments, the adhesive 312 may be removed from the entire back-side 310b of the chip 310 by means of a drilling process (e.g. a laser drilling process) and/or a dissolution process (e.g. a process that uses a solvent to dissolve the adhesive 312) and/or an etching process (e.g. a plasma etching process).

Although FIG. 3J shows that the at least one second opening 322a, 322b formed in the insulating layer 314 (e.g. in respect of the at least one opening 322a) and in the adhesive 312 (e.g. in respect of the at least one opening 322a), this may vary with other embodiments. For example, the chip 310 may be used for purposed other than power applications. Accordingly, an electrically conductive connection to the back-side 310b of the chip 310 may not be necessary. Therefore, in such an embodiment, the at least one opening 322a may be formed to expose at least one contact (e.g. the at least one bonding pad 310c) disposed on the front-side 310a of the chip 310. In other words, the at least one opening 322b may not be formed to expose the back-side 310b of the chip 310.

In one or more embodiments, the at least one second opening 322a, 322b may include, or may be, at least one of a via (e.g. a micro-via or a through-via), and a contact hole. For example, the at least one second opening 322a formed in the insulating layer 314 to expose at least one contact of the chip 310 (e.g. the at least one bonding pad 310c) disposed on the front-side 310a of the chip 310 may be a via (e.g. a micro-via or a through-via). By way of another example, the at least one second opening 322b formed in the adhesive 312 to expose the at least one contact of the chip 310 (e.g. a metallization layer) disposed on the back-side 310b of the chip 310 may be a contact hole.

In one or more embodiments, forming the at least one second opening 322a, 322b to expose the at least one contact of the chip 310 may include a drilling process (e.g. a laser drilling process). The drilling process (e.g. laser drilling process) may remove material in order to expose the at least one contact of the chip 310. For example, the at least one opening 322b in the adhesive 312 may be formed by removing at least a part of the adhesive 312 by means of the drilling process. By way of another example, the at least one opening 322a in the insulating layer 314 may be formed by removing a part of the metal layer 320 and a part of the insulating layer 312 disposed below the metal layer 320 by means of a drilling process (e.g. a laser drilling process).

In one or more embodiments, forming the at least one second opening 322a, 322b to expose the at least one contact of the chip 310 may include a plasma treating process and/or a chemical treatment process. For example, at least a part of the adhesive 312 (which may include a thermosetting material) may be removed by means of a plasma treating process. By way of another example, at least a part of the adhesive 312 (which may include a thermoplastic material) may be removed by means of a chemical treatment process.

In one or more embodiments, manufacturing the chip (or die) arrangement may include forming (e.g. by means of an etching process and/or drilling process, for example, a laser drilling process) at least one third opening 324 to expose a part of the surface 302a of the metal structure 302b (shown in FIG. 3J). In one or more embodiments, the at least one third opening 324 may be required to form an electrically conductive connection between the at least one contact of the chip 310 and the metal structure 302b.

In one or more embodiments, an effect of the method illustrated in FIG. 3I and FIG. 3J may be formation of second openings 322a, 322b and/or third openings 324 that may be shorter in depth as compared to openings formed in the conventional method illustrated in FIG. 1F since the chip 310 may be disposed within the opening 306, in contrast to being diposed over a planar surface of the leadframe 102 in FIG. 1F.

The method illustrated in FIG. 3I and FIG. 3J may be used to remove the carrier 304 to thereby expose at least one contact of the chip 310. In other words, removing the carrier 304 to thereby expose at least one contact of the chip 310 may include removing the carrier 304 from the chip 310 and the metal structure 302b (e.g. in FIG. 3I); and forming at least one second opening 322a, 322b to expose the at least one contact of the chip 310 (e.g. in FIG. 3J). In one or more embodiments, the method illustrated in FIG. 3I and FIG. 3J may correspond to removing the carrier to thereby expose at least one contact of the chip (in 206) of method 200 shown in FIG. 2.

In one or more embodiments, manufacturing the chip (or die) arrangement may include forming an electrically conductive connection between the at least one contact of the chip 310 and the metal structure 302b.

FIG. 3K to FIG. 3N show cross-sectional views 319, 321, 323 and 325 where an electrically conductive connection is formed between the at least one contact of the chip 310 and the metal structure 302b.

In one or more embodiments, forming the electrically conductive connection between the at least one contact of the chip 310 and the metal structure 302b may include a plating process. For example, the plating process may include an electroless plating process or an electrochemical plating process or a direct metallization process.

As shown in FIG. 3K in the view 319, forming the electrically conductive connection between the at least one contact of the chip 310 and the metal structure 302b may include forming a plating mask 326 over at least a part of the chip 310 and over a first part of a surface of the metal structure 302b. As shown in FIG. 3K, the surface of the metal structure 302b may be a front-side 302a and/or a back-side 302d of the metal structure 302b.

The plating mask 326 may be formed such that the at least one contact of the chip 310 (e.g. contact disposed on the front-side 310a and/or back-side 310b of the chip 310) is free from the plating mask 326. In like manner, the plating mask 326 may be formed such that a second part of the surface of the metal structure 302b is free from the plating mask 326, as shown in FIG. 3K.

In one or more embodiments, the plating mask 326 may be formed by depositing a resist material over the surface of the metal structure 302b and the chip 310, and patterning the resist material. In one or more embodiments, patterning the resist material may include, or may consist of, a lithographic process (e.g. a photo-lithographic process).

As shown in FIG. 3L in the view 321, forming the electrically conductive connection between the at least one contact of the chip 310 and the metal structure 302b may include plating (e.g. by means of an electroless plating process or an electrochemical plating process) an electrically conductive layer 328 over the at least one contact of the chip 310 and the second part of the surface of the metal structure 302b using the plating mask 326 as a mask.

In one or more embodiments, the plating process may be carried out at a temperature less than or equal to about 150° C., for example less than or equal to about 100° C., for example less than or equal to about 50° C., for example less than or equal to about 35° C., for example about room temperature.

An effect of using a plating process to form the electrically conductive connection between the at least one contact of the chip 310 and the metal structure 302b may be manufacture of an interconnection (e.g. metallurgical interconnection) between the chip 310 and the metal structure 302 (e.g. a relatively thick copper layer) in relatively low temperature. For example, the bonding process used to attach the chip 104 (or die) to the leadframe 102 in FIG. 1A may be performed at temperature in the range from about 200° C. to about 350° C.

In one or more embodiments, an effect of using a plating process to form the electrically conductive connection may be prevention or substantial reduction of the formation of copper silicides which may damage and/or cause failure to the chip 310.

In one or more embodiments, an effect of using a plating process to form the electrically conductive connection may be less warpage of the metal structure 302b and/or the chip 310 due to lower processing temperatures.

In one or more embodiments, an effect of using a plating process to form the electrically conductive connection may be formation of a reliable interconnection (e.g. metallurgical connection) between the chip 310 and metal structure 302 (e.g. a copper core layer).

As shown in FIG. 3M in the view 323, forming the electrically conductive connection between the at least one contact of the chip 310 and the metal structure 302b may include removing the plating mask 326 (e.g. by means of a stripping process, for example a chemical stripping process) after plating the electrically conductive layer 328.

As shown in FIG. 3N in the view 325, forming the electrically conductive connection between the at least one contact of the chip 310 and the metal structure 302b may include patterning the electrically conductive layer 328 to form a patterned electrically conductive layer 328'. The patterned electrically conductive layer 328' may, for example, be a circuit pattern of the chip arrangement (e.g. the embedded chip package). In one or more embodiments, patterning the electrically conductive layer 328 may include an etching process (e.g. a plasma etching process).

The method illustrated in FIG. 3K to FIG. 3N may be used to form the electrically conductive connection between the at least one contact of the chip 310 and the metal structure 302b. Nonetheless, in another embodiment, forming the electrically conductive connection between the at least one contact of the chip 310 and the metal structure 302b may include depositing (e.g. by means of plating) an electrically conductive material (e.g copper) over the at least one contact of the chip 310 and the metal layer 320 shown in FIG. 3J, and patterning (e.g. by means of etching) the electrically conductive material to form the electrically conductive layer 328' shown in FIG. 3N.

In one or more embodiments, at least one additional conductive layer may be formed over the electrically conductive layer 328'. In one or more embodiments, the at least one additional conductive layer formed over the electrically conductive layer 328' may form a multi-layer electrically conductive layer (e.g. first conductive structure 608a and second conductive structure 608b shown in FIG. 6B). An effect of forming the at least one additional conductive layer over the electrically conductive layer 328' may be improved routing capability of the chip arrangement.

FIG. 3O shows a view 327 in which singulation (indicated by arrows 327) is performed to separate one chip arrangement (e.g. a chip package) from another. In one or more embodiments, singulation may be performed on a dicing street that may be free from material of the metal structure 302b (e.g. free from copper).

Figure 4A:
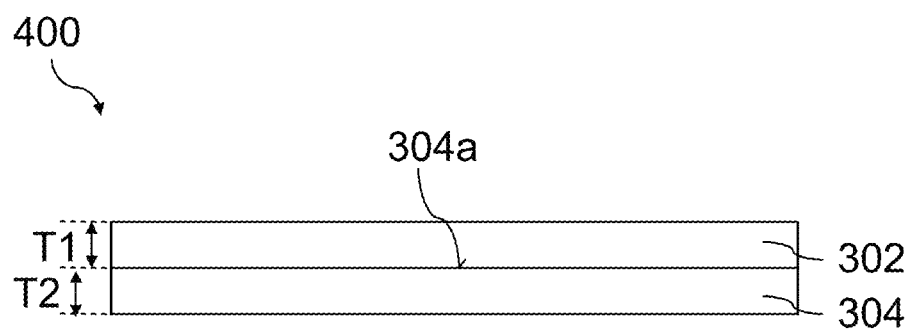
FIG. 4A to FIG. 4O show various views illustrating a method for manufacturing a chip arrangement according to various embodiments.
Figure 4B:
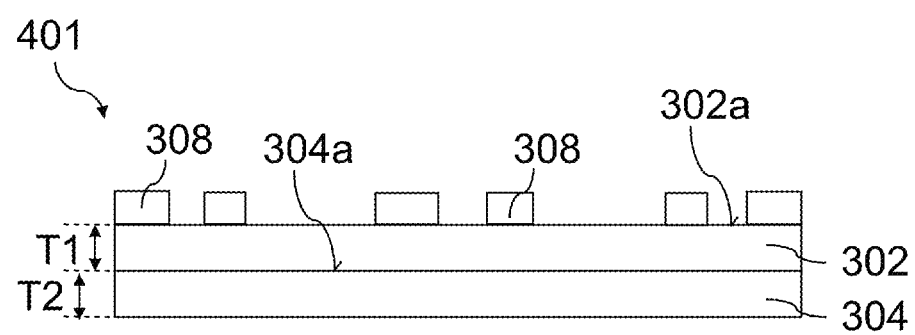
Figure 4C:
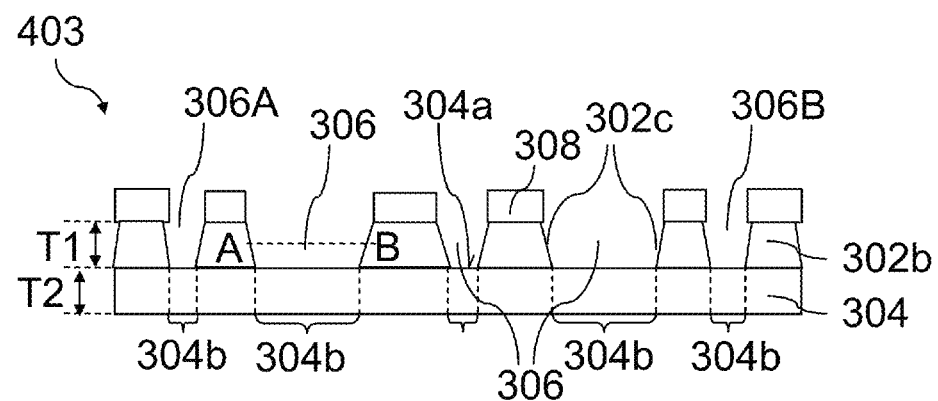
Figure 4D:
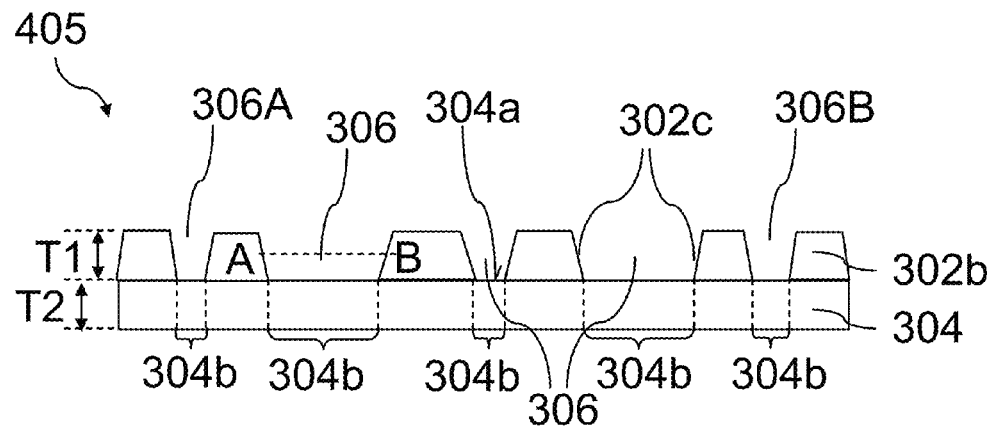
Figure 4E:
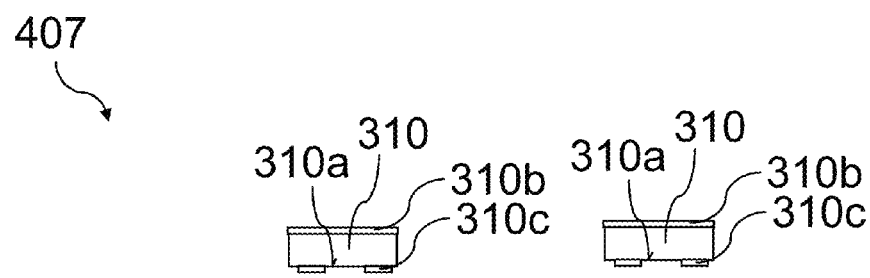
Figure 4E:
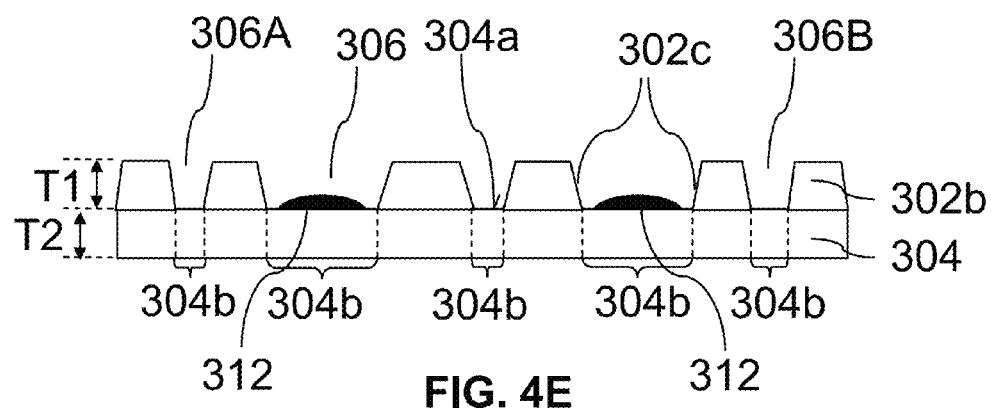
Figure 4F:
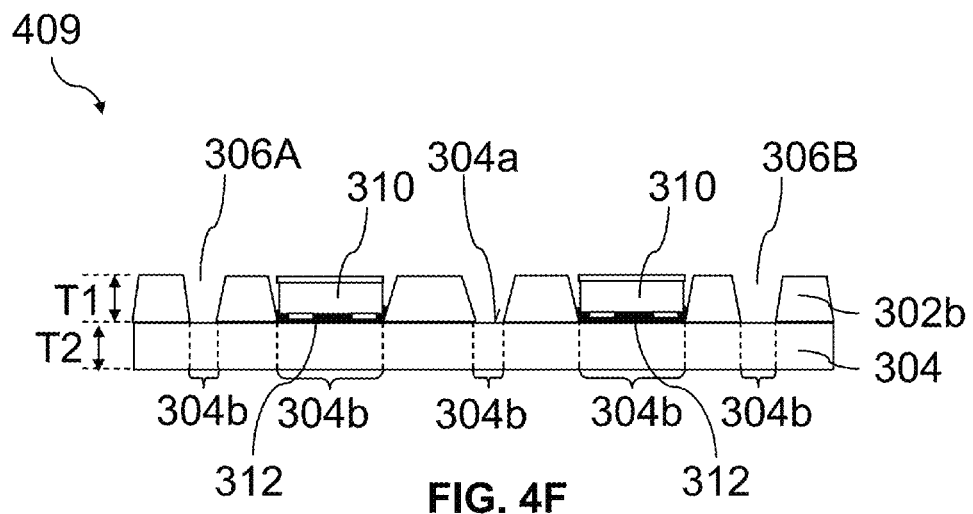
Figure 4G:
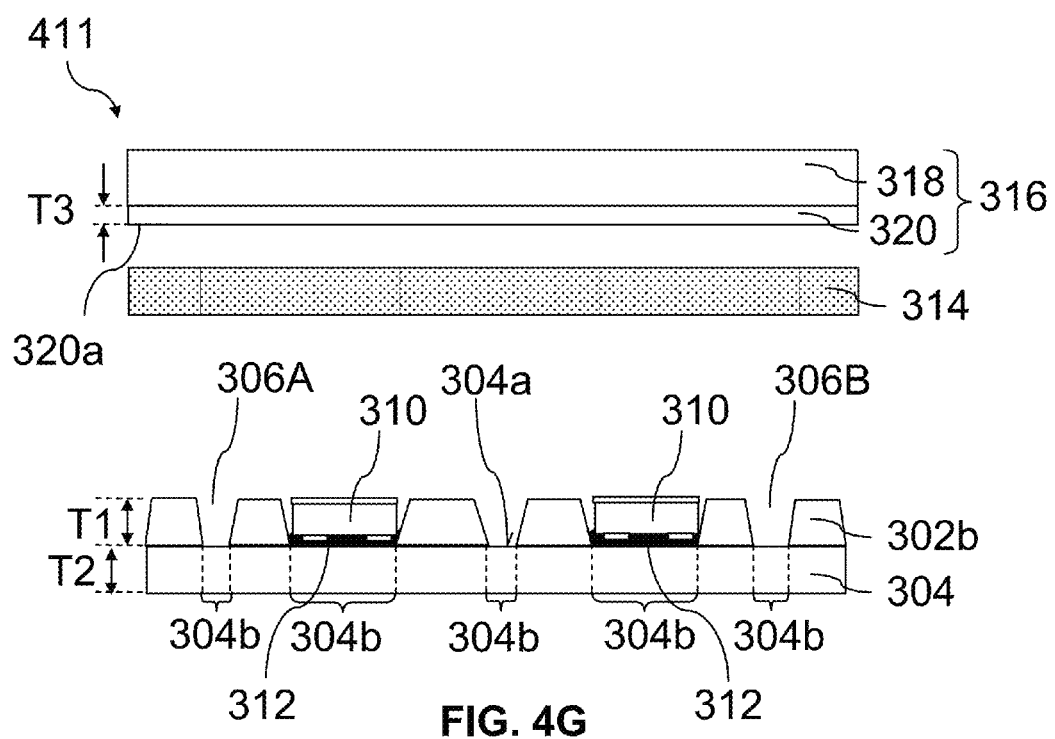
Figure 4H:
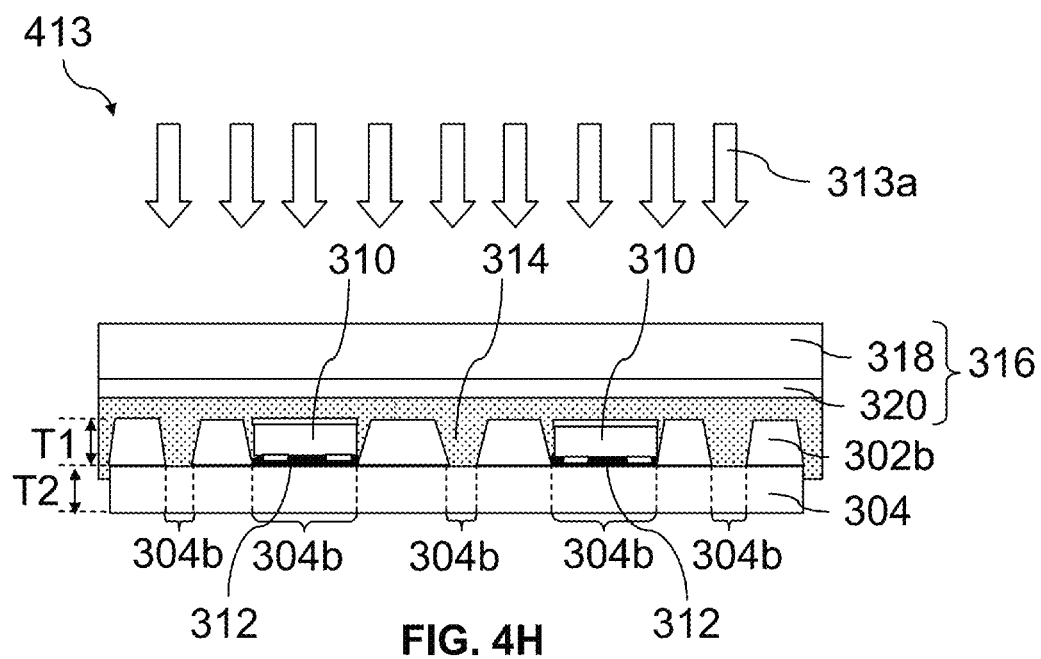
Figures 1, 4I:
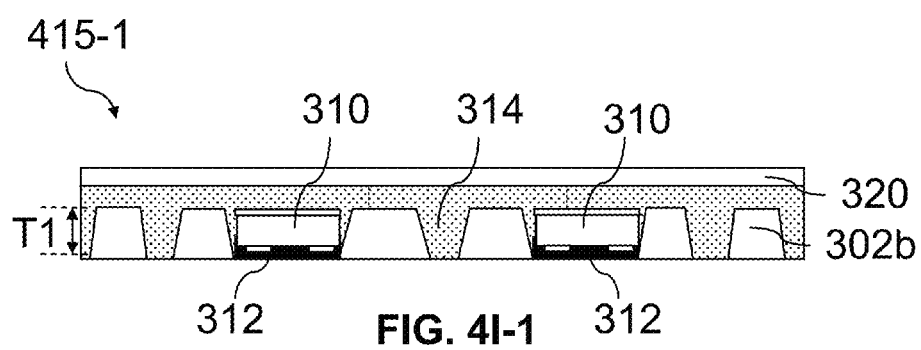
Figures 2, 4I:
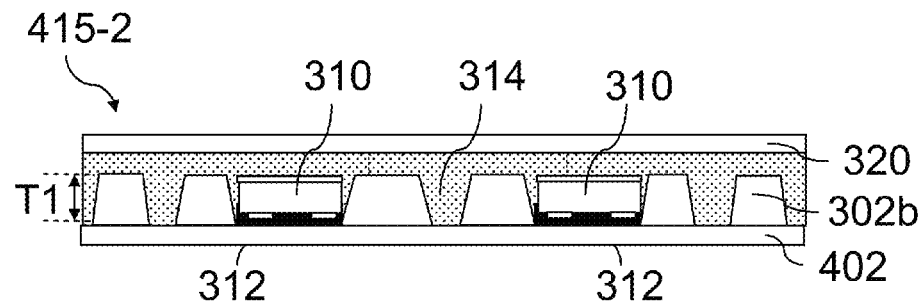
Figure 4J:
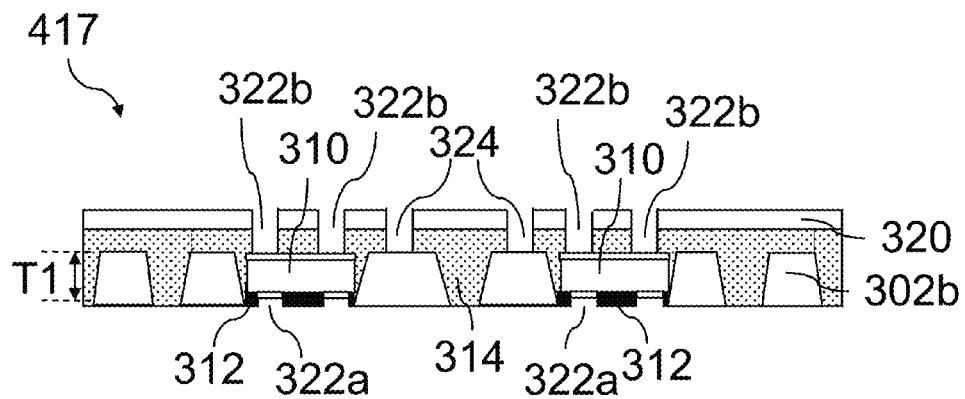
Figure 4K:
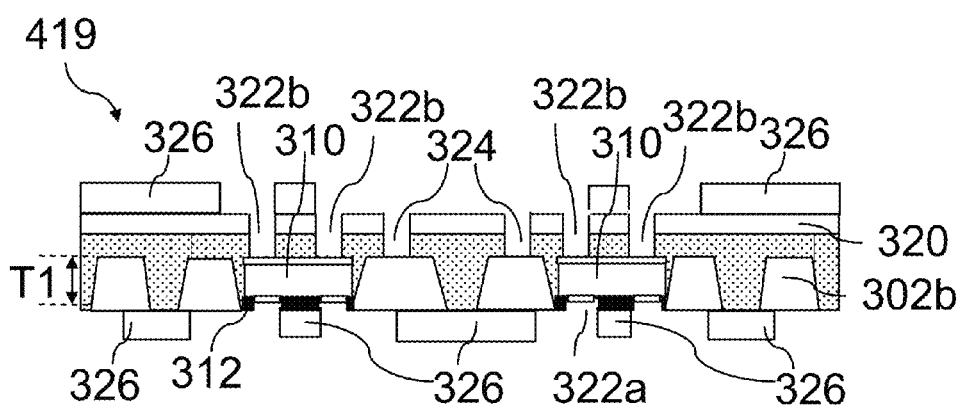
Figure 4L:
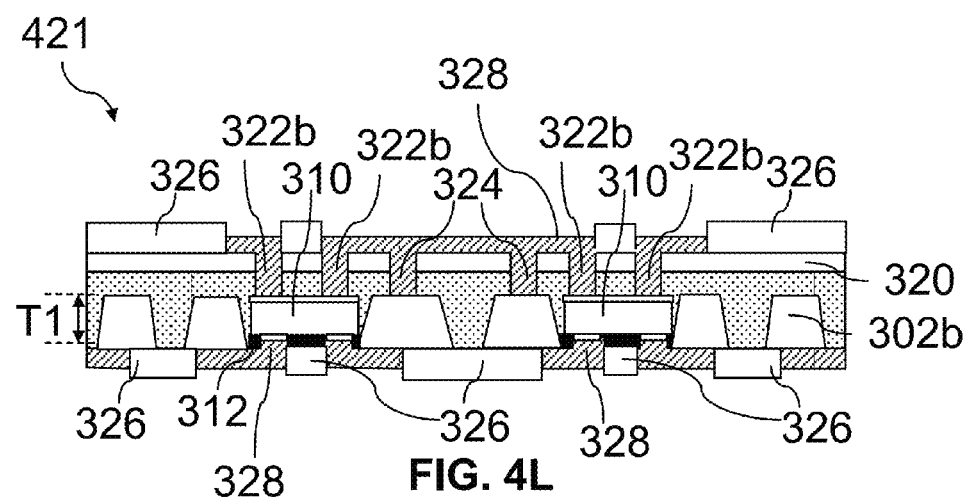
Figure 4M:
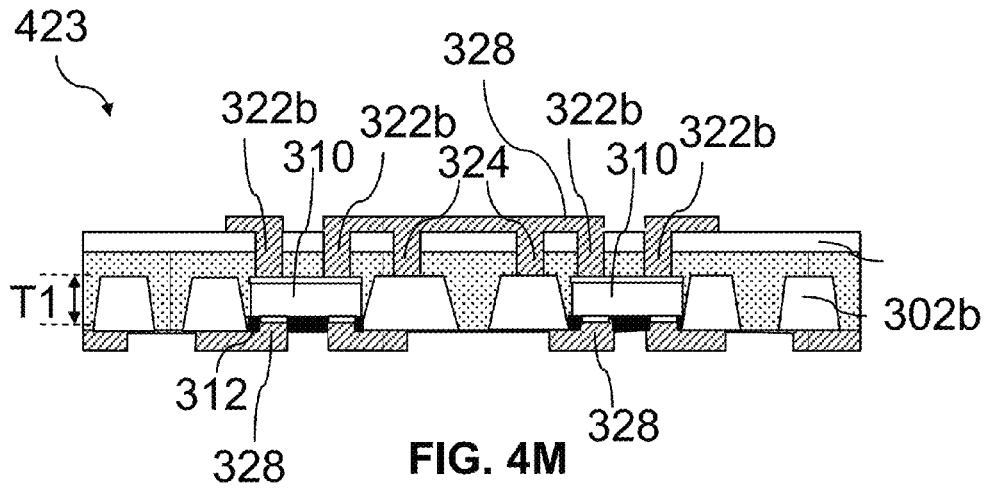
Figure 4N:
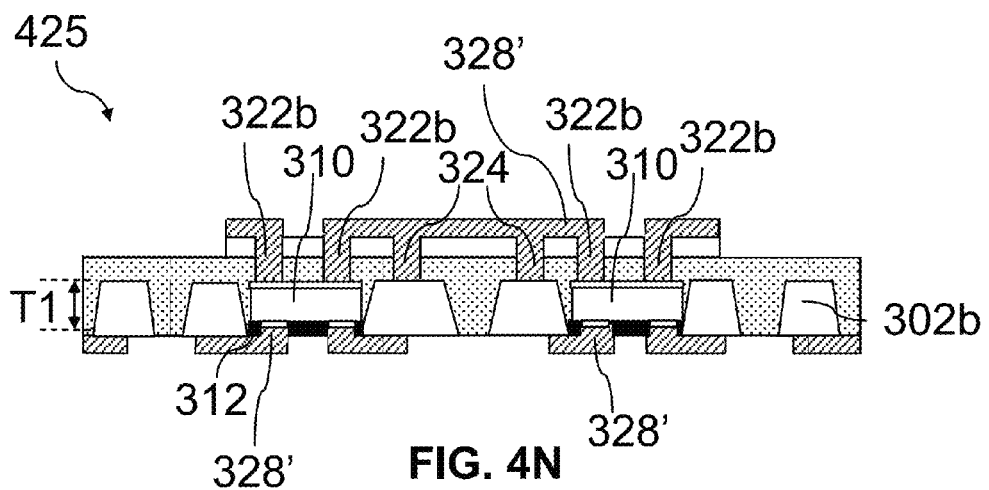
Figure 4O:
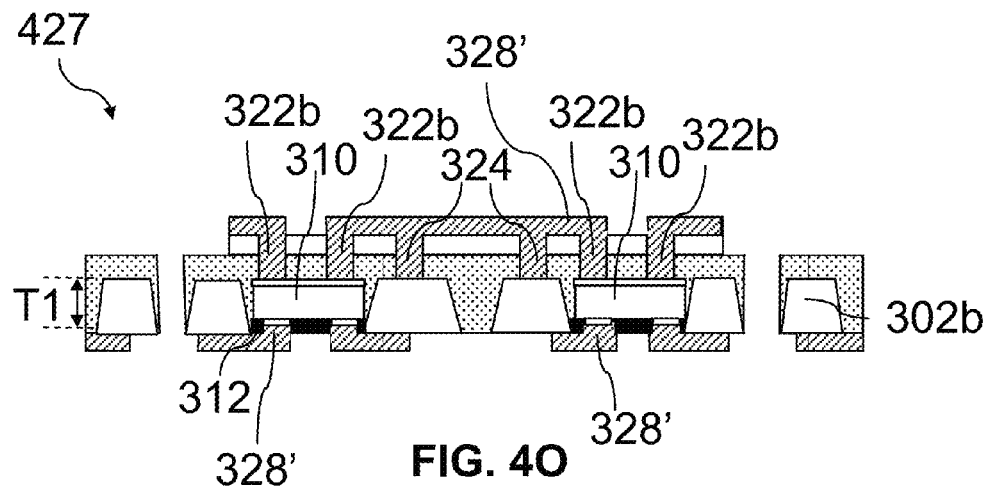

FIG. 4A to FIG. 4O show various cross-sectional views illustrating a method for manufacturing a chip (or die) arrangement according to various embodiments.

Reference signs in FIG. 4A to FIG. 4O that are the same as in FIG. 3A to FIG. 3O denote the same or similar elements as in FIG. 3A to FIG. 3O. Thus, those elements will not be described in detail again here; reference is made to the description above. Differences between FIG. 4A to FIG. 4O and FIG. 3A to FIG. 3O are described below.

As shown in FIG. 4F in the view 409, disposing the chip 310 (or die) within the opening 306 may include disposing the chip 310 over the adhesive 312. As shown in FIG. 4F, the chip 310 (or die) may be disposed within the opening 306 such that the front-side 310a of the chip 310 faces the surface 304a of the carrier 304. In other words, the back-side 310b of the chip 310 may face away (i.e. may be remote from) the surface 304a of the carrier 304. In one or more embodiments, the front-side 310a of the chip 310 may be substantially flush (e.g. substantially planar) with a surface of the metal structure 302b facing the carrier 304 (e.g. the surface opposite the surface 302a of the metal structure 302.

As shown in FIG. 4I-1 in the view 415-1, exposing at least one contact of the chip 310 may include removing the carrier 304. As described above, the metal structure 302 may include, or may consist of, a material that may be selectively etchable to a material of the carrier 304. Accordingly, in one or more embodiments, the carrier 304 may be removed by means of, for example, an etching process (e.g. a plasma etching process), which may leave the material of the metal structure 302 at least substantially unperturbed and/or unremoved.

In one or more embodiments, removing the carrier 304 may include peeling away the carrier 304. For example, as described above, the carrier 304 may include, or may consist of a metal layer (e.g. a copper layer) having a coating (e.g. a coated layer) interposed between the metal layer and the metal structure 302. In such an embodiment, the carrier 304 may, for example, be removed by means of peeling the metal layer and the coating from the metal structure 302.

In one or more embodiments, an optional insulation layer 402 (e.g. an insulation resin layer) may be formed (e.g. by means of lamination) after removal of the carrier 304, as shown in FIG. 4I-2 in a view 415-2. For example, the insulation layer 402 may be formed over the adhesive 312 such that the front-side 310a of the chip 310 (or die) faces the insulation layer 402, as shown in FIG. 4I-2. In one or more embodiments, the insulation layer 402 may, as a consequence of being formed (e.g. by means of lamination) over the adhesive 312, be formed over a surface (e.g. a bottom surface) of the metal structure 302b and/or a part of a surface (e.g. a bottom surface) of the insulating layer 314, as shown in FIG. 4I-2.

In one or more embodiments, the insulation layer 402 (e.g. an insulation resin layer) may include a seed metal or seed metal alloy (e.g. seed copper) that may be used in forming (e.g. by means of plating) an electrically conductive connection between the at least one contact of the chip 310 and the metal structure 302b. Hereafter, the description of the method for manufacturing a chip (or die) arrangement continues from the embodiment in which the optional insulation layer 402 is not formed after removal of the carrier 304. In other words, the description that follows continues from FIG. 4I-1.

As shown in FIG. 4J in the view 417, exposing at least one contact of the chip 310 may further include forming at least one second opening 322a, 322b to expose the at least one contact of the chip 310. The at least one second opening 322a, 322b may be required to form an electrically conductive connection between the at least one contact of the chip 310 and the metal structure 302b.

As described above, the chip 310 may, for example, be a chip used for MEMS and/or logic and/or memory and/or power applications. Therefore, in one or more embodiments, exposing at least one contact of the chip 310 may include forming at least one second opening 322a to expose at least one contact (e.g. the bonding pad 310c) disposed on the front-side 310a of the chip 310 (e.g. in a chip used for logic and/or memory). In like manner, in one or more embodiments, exposing at least one contact of the chip 310 may additionally include forming at least one second opening 322b to expose at least one contact (e.g. a metallization layer) disposed on the back-side 310b of the chip 310 (e.g. in a chip used for power applications).

For example, the chip 310 shown in FIG. 4J may be used for power applications. Accordingly, the chip 310 may require a current flow between its front-side 310a and its back-side 310b. Accordingly, the at least one second opening 322a, 322b may be formed to expose at least one contact (e.g. a metallization layer) disposed on the back-side 310b of the chip 310 (e.g. in respect of the at least one second opening 322b) and on the front-side 310a of the chip 310 (e.g. in respect of the at least one second opening 322a). Accordingly, in the arrangement shown in FIG. 4J, the at least one opening 322a, 322b may be formed in the insulating layer 314 and in the adhesive 312.

Although FIG. 4J shows that the at least one second opening 322a, 322b formed in the insulating layer 314 and in the adhesive 312, this may vary with other embodiments. For example, the chip 310 may be used for purposes other than power applications. Accordingly, an electrically conductive connection to the back-side 310b of the chip 310 may not be necessary. Therefore, in such an embodiment, the at least one opening 322a may be formed to expose at least one contact (e.g. the at least one bonding pad 310c) disposed on the front-side 310a of the chip 310. In other words, the at least one opening 322a may be formed in the adhesive 312 and not in the insulating layer 314. Stated in yet another way, the at least one opening 322b may not be formed to thereby expose at least one contact disposed on the back-side 310b of the chip 310.

In an embodiment in which the insulation layer 402 is formed after removal of the carrier 304 (e.g. as shown in FIG. 4I-2), the at least one second opening 322a may be formed by removing a part of the insulation layer 402 and a part of the adhesive 312 to expose at least one contact (e.g. the at least one bonding pad 310c) disposed on the front-side 310a of the chip 310. In other words, the at least one opening 322a may be formed after forming (e.g. laminating) the insulation layer 402.

In one or more embodiments, the at least one second opening 322a, 322b may include, or may be, at least one of a via (e.g. a micro-via or a through-via), and a contact hole. For example, the at least one second opening 322a formed in the adhesive 312 to expose at least one contact of the chip 310 (e.g. the at least one bonding pad 310c) disposed on the front-side 310a of the chip 310 may be a via (e.g. a micro-via or a through-via). By way of another example, the at least one second opening 322b formed in the insulating layer 314 to expose the at least one contact of the chip 310 (e.g. a metallization layer) disposed on the back-side 310b of the chip 310 may be a contact hole and/or a via.

Figure 5:
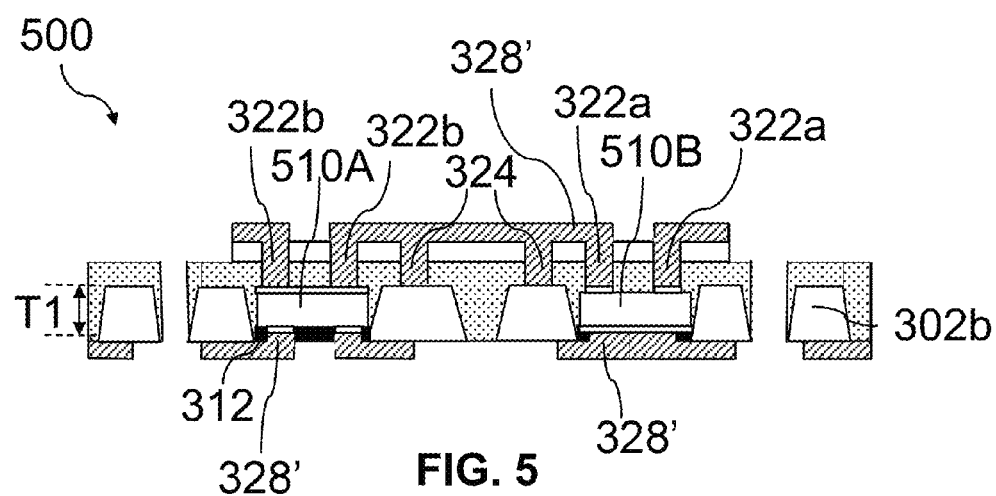
FIG. 5 shows a chip arrangement according to various embodiments.

FIG. 5 shows a cross-sectional view 500 of a chip (or die) arrangement manufactured according to various embodiments.

Reference signs in FIG. 5 that are the same as in FIG. 3A to FIG. 3O denote the same or similar elements as in FIG. 3A to FIG. 3O. Thus, those elements will not be described in detail again here; reference is made to the description above. Differences between FIG. 5A to FIG. 5O and FIG. 3A to FIG. 3O are described below.

In one or more embodiments, the chip arrangement may include a plurality of chips 510-A and 510-B. In one or more embodiments, at least one chip of the plurality of chips 510-A and 510-B may be disposed within the opening 306 such that the front-side 310a of the at least one chip faces the surface 304a of the carrier 304. For example, in FIG. 5, chip 510-A is disposed within the opening 306 such that the front-side 310a of the at least one chip faces the surface 304a of the carrier 304. In one or more embodiments, at least one chip of the plurality of chips 510-A and 510-B may be disposed within the opening 306 such that the back-side 310b of the at least one chip faces the surface 304a of the carrier 304. For example, in FIG. 5, chip 510-B is disposed within the opening 306 such that the back-side 310b of the at least one chip faces the surface 304a of the carrier 304.

The further features described above in FIG. 3A to 3O and FIG. 4A to FIG. 4O in relation to forming at least one second opening 322a, 322b to expose the at least one contact of the chip 310 may be equally applicable to forming at least one second opening 322a, 322b to expose at least one contact of each chip of the plurality of chips 510-A and 510-B.

Figure 6A:
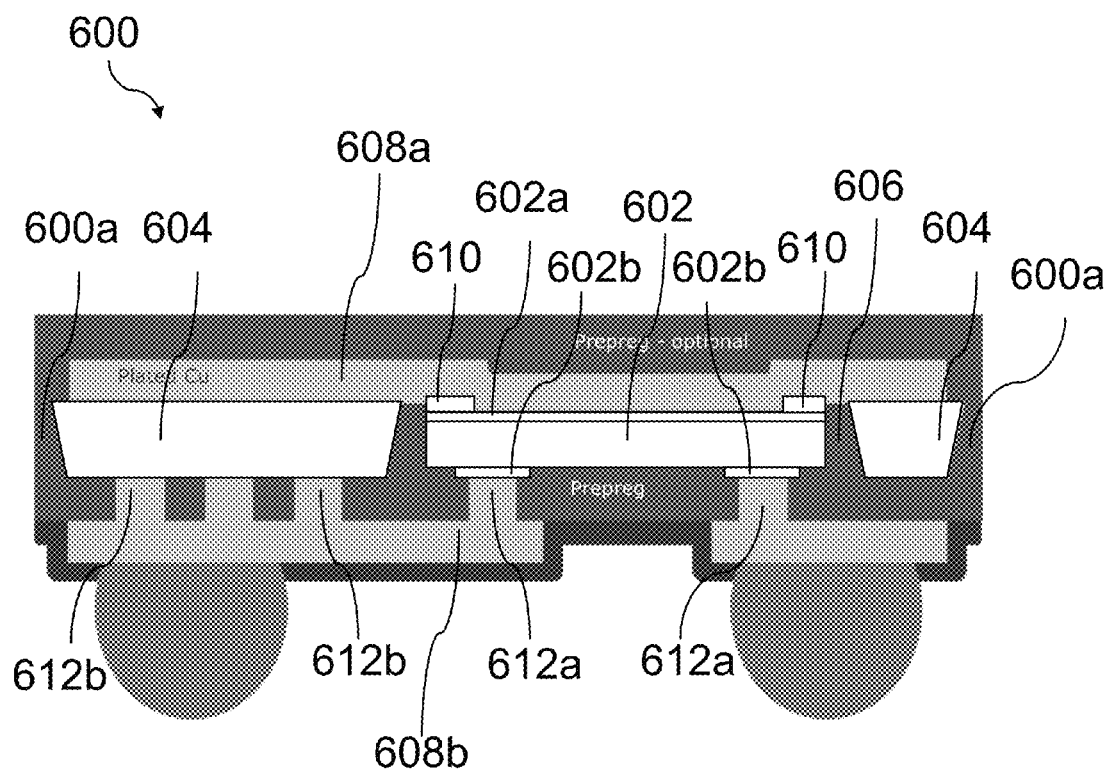
FIG. 6A and FIG. 6B shows cross-sectional views of chip arrangements according to various embodiments.
Figure 6B:
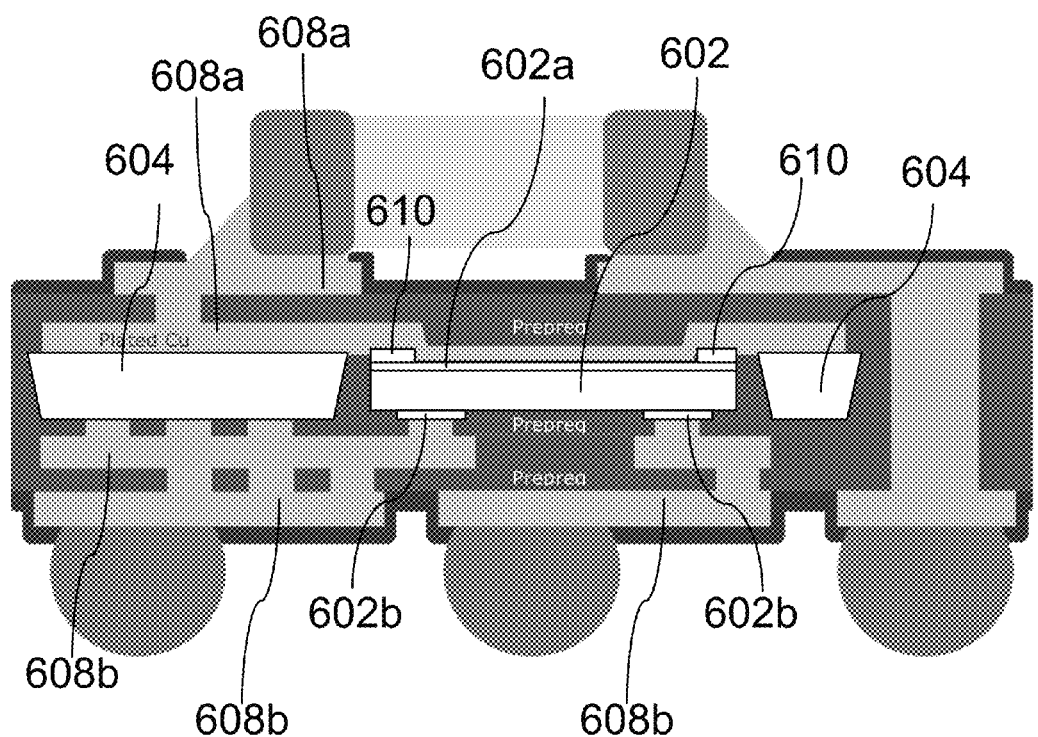

FIG. 6A and FIG. 6B shows cross-sectional views of chip arrangements according to various embodiments.

The features described above in FIG. 3A to 3O in relation to forming various structures in a chip arrangement may be equally applicable to forming various structures of the chip arrangements shown in FIG. 6A and FIG. 6B.

As shown in FIG. 6A in a view 600, a chip arrangement may include a chip 602 disposed within an opening 606 of a metal structure 604. In one or more embodiments, at least one contact 602a, 602b of the chip 602 may be electrically connected to the metal structure 604. For example, the at least one contact 602a of the chip 602 may be electrically connected to the metal structure 604 by means of a first conductive structure 608a. In one or more embodiments, the first conductive structure 608a may be formed by a plating process, or any other process described above in relation to forming an electrically conductive connection between the chip 610 and the metal structure 604 (e.g. a metal core layer). By way of another example, the at least one contact 602b of the chip 602 may be electrically connected to the metal structure 604 by means of a second conductive structure 608b. In one or more embodiments, the second conductive structure 608b may be formed by a plating process, or any other process described above in relation to forming an electrically conductive connection between the chip 610 and the metal structure 604 (e.g. a metal core layer). In one or more embodiments, a part of the first conductive structure 608a and/or a part of the second conductive structure 608b may be formed over a part of the chip 602 by the plating process or by any other process described above in relation to forming an electrically conductive connection between the chip 610 and the metal structure 604 (e.g. a metal core layer). In one or more embodiments a part of a surface (e.g. a back-side) of the chip 602 may be covered by an adhesive 610 (e.g. a non-conductive paste). In one or more embodiments, the adhesive 610 may form a sealing ring at an edge of the chip 602. As described above, in other embodiments, the adhesive 610 may be completely removed during manufacture of the chip arrangement shown in FIG. 6A. Accordingly, in other embodiments, a part of a surface (e.g. a back-side) of the chip 602 may be free from the adhesive 610. In one or more embodiments, the opening 606 of the metal structure 604 may be formed by means of an etching process (e.g. a plasma etching process), or any other process described above in relation to forming an opening 606 in the metal structure 604 (e.g. a metal core layer). In one or more embodiments, a sidewall of the opening 606 may have a trapezoid shape as a result of the etching process. In one or more embodiments, the etching process may result in a shielded edge for the chip arrangement. In other words, an edge 600a of the chip arrangement may be free from material of the metal structure 604 (e.g. copper). In one or more embodiments, an edge of the chip arrangement that may be free from material of the metal structure 604 may be a dicing street.

In one or more embodiments, the chip arrangement may include a plurality of vias 612a, 612b. The plurality of vias 612a, 612b may be filled with a conductive material, and a depth of a via of the plurality of vias 612a, 612b may be substantially equal to a depth of another via of the plurality of vias 612a, 612b. In one or more embodiments, the plurality of vias 612a, 612b may include at least one via formed at a surface of the chip 602. For example, in FIG. 6A, via 612a may be formed at a surface of the chip 602. In one or more embodiments, the plurality of vias 612a, 612b may include at least one via formed at a surface of the metal structure 604. For example, in FIG. 6A, via 612b may be formed at a surface of the metal structure 604. In one or more embodiments, a surface of the chip 602 may be at least substantially flush with a surface of the metal structure 604. For example, the back-side of the chip 602 shown in FIG. 6A may be substantially flush with a surface of the metal structure 604.

FIG. 6B shows a view 601 illustrating a chip arrangement in which the conductive structure 608a, 608b is arranged as a plurality of layers over the chip 602 and the metal structure 604. For example, as described above in relation to FIG. 3N, in one or more embodiments, at least one additional conductive layer may be formed over the electrically conductive layer 328'. In other words, the conductive structure forming the electrically conductive connection between the chip 602 and the metal structure 604 may be a multi-layer electrically conductive layer (as shown in FIG. 6B in relation to conductive structure 608a, 608b). An effect of forming the multi-layer electrically conductive layer 608a, 608b may be improved routing capability of the chip arrangement. The features described above in relation to the chip arrangement shown in FIG. 6A may be equally applicable to the chip arrangement shown in FIG. 6B.

According to one or more embodiments, a method for manufacturing a chip arrangement may be provided. In one or more embodiments, the method may include: placing a chip on a carrier within an opening of a metal structure disposed over the carrier; fixing the chip to the metal structure; removing the carrier to thereby expose at least one contact of the chip; and forming an electrically conductive connection between the at least one contact of the chip and the metal structure.

In one or more embodiments, forming the electrically conductive connection between the at least one contact of the chip and the metal structure may include a plating process.

In one or more embodiments, the plating process may include one of an electroless plating process and an electrochemical plating process.

In one or more embodiments, the at least one contact of the chip may be disposed over at least one of a front-side and a back-side of the chip.

In one or more embodiments, forming the electrically conductive connection between the at least one contact of the chip and the metal structure may include: forming a plating mask over at least a part of the chip and over a first part of a surface of the metal structure, wherein the at least one contact of the chip and a second part of the surface of the metal structure may be free from the plating mask; and plating an electrically conductive layer over the at least one contact of the chip and the second part of the surface of the metal structure using the plating mask as a mask.

In one or more embodiments, forming the electrically conductive connection between the at least one contact of the chip and the metal structure may include: depositing an electrically conductive material over the at least one contact of the chip and the metal layer; and patterning the electrically conductive material.

In one or more embodiments, the surface of the metal structure may include at least one of a front-side and a back-side of the metal structure.

In one or more embodiments, forming the electrically conductive connection between the at least one contact of the chip and the metal structure may further include: removing the plating mask from the part of the chip and the first part of the surface of the metal structure after plating the electrically conductive layer.

In one or more embodiments, removing the plating mask may include a stripping process.

In one or more embodiments, forming the electrically conductive connection between the at least one contact of the chip and the metal structure may further include: patterning the electrically conductive layer.

In one or more embodiments, patterning the electrically conductive layer may include an etching process.

In one or more embodiments, placing the chip on the carrier within the opening of the metal structure disposed over the carrier may include: providing the metal structure disposed over a surface of the carrier; forming the opening in a part of the metal structure to expose a part of the surface of the carrier; and disposing the chip within the opening of the metal structure, and over the part of the surface of the carrier that is exposed.

In one or more embodiments, forming the opening in the part of the metal structure to expose the part of the surface of the carrier may include an etching process.

In one or more embodiments, the etching process may include a selective etching process.

In one or more embodiments, forming the opening in the part of the metal structure to expose the part of the surface of the carrier may include: forming an etch mask over a surface of the metal structure; and etching the part of the metal structure to expose the part of the surface of the carrier using the etch mask as a mask.

In one or more embodiments, forming the opening in the part of the metal structure to expose the part of the surface of the carrier may further include: removing the etch mask from the surface of the metal structure.

In one or more embodiments, forming the etch mask over the surface of the metal structure may include: depositing a resist material over the surface of the metal structure; and patterning the resist material.

In one or more embodiments, patterning the resist material may include a lithographic process.

In one or more embodiments, disposing the chip within the opening of the metal structure, and over the part of the surface of the carrier that is exposed may include: disposing an adhesive over the part of the surface of the carrier that is exposed; and disposing the chip over the adhesive.

In one or more embodiments, the adhesive may include a non-conductive material.

In one or more embodiments, the adhesive may include a non-conductive paste.

In one or more embodiments, disposing the chip within the opening of the metal structure, and over the part of the surface of the carrier that is exposed may further include: heating the adhesive after disposing the chip over the adhesive.

In one or more embodiments, heating the adhesive may include a curing process.

In one or more embodiments, placing the chip on the carrier within the opening of the metal structure disposed over the carrier may further include: roughening the metal structure and the part of the surface of the carrier that is exposed.

In one or more embodiments, roughening the metal structure and the part of the surface of the carrier that is exposed may include an etching process.

In one or more embodiments, roughening the metal structure and the part of the surface of the carrier that is exposed may include a micro-etching process.

In one or more embodiments, fixing the chip to the metal structure may include: forming an insulating layer over the chip and the metal structure, wherein the insulating layer fills the opening of the metal structure.

In one or more embodiments, fixing the chip to the metal structure may include: placing an insulating layer between a conductive layer and the chip and the metal structure disposed over the carrier; and applying heat and pressure to fuse the conductive layer, the insulating layer and the chip and the metal structure disposed over the carrier.

In one or more embodiments, the insulating layer may fill the opening of the metal structure and may be disposed over the chip and the metal structure.

In one or more embodiments, fixing the chip to the metal structure may further include: removing a part of the conductive layer after fusing the metal layer, the insulating layer and the chip and the metal structure disposed over the carrier.

In one or more embodiments, the conductive layer may include a second carrier and a metal layer disposed over the second carrier, wherein a surface of the metal layer may face the insulating layer, and wherein removing the part of the conductive layer may include removing the second carrier from the metal layer.

In one or more embodiments, removing the carrier to thereby expose at least one contact of the chip may include: removing the carrier from the chip and the metal structure; and forming at least one second opening to expose the at least one contact of the chip.

In one or more embodiments, removing the carrier from the chip and the metal structure may include an etching process.

In one or more embodiments, the at least one second opening may be formed in an insulating layer.

In one or more embodiments, the at least one second opening may be formed in an adhesive.

In one or more embodiments, forming the at least one second opening to expose the at least one contact of the chip may include at least one of a drilling process, a plasma treating process, and a chemical treatment process.

In one or more embodiments, the metal structure may include a material that is selectively removable to a material of the carrier.

In one or more embodiments, the carrier may include a metal or metal alloy.

In one or more embodiments, the carrier may include aluminum or an aluminum alloy.

In one or more embodiments, the metal structure may include copper or a copper alloy.

In one or more embodiments, a thickness of the carrier may be in the range from about 40 µm to about 200 µm.

In one or more embodiments, a thickness of the metal structure may be in the range from about 50 µm to about 100 µm.

In one or more embodiments, the insulating layer may include at least one of a prepreg and a resin material.

According to one or more embodiments, a method for manufacturing a chip arrangement may be provided. In one or more embodiments, the method may include: providing a metal structure disposed over a carrier; forming at least one first opening in the metal structure to expose a part of the carrier; disposing at least one chip within the at least one first opening, wherein an adhesive layer attaches the at least one chip to the part of the carrier that is exposed; forming an insulating layer over the at least one chip and the metal structure, wherein the insulating layer fills the at least one first opening; forming at least one second opening in at least one of the insulating layer and the adhesive layer to expose at least one of a part of the at least one chip and a part of the metal structure; and plating an electrically conductive layer over the part of the at least one chip and the part of the metal structure that is exposed.

According to one or more embodiments, a chip arrangement may be provided. In one or more embodiments, the chip arrangement may include: a chip disposed within an opening of a metal structure; wherein at least one contact of the chip is electrically connected to the metal structure, and wherein a surface of the chip is at least substantially flush with a surface of the metal structure.

While various aspects of this disclosure have been particularly shown and described with reference to these aspects of this disclosure, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:

1. A method for manufacturing a chip arrangement, the method comprising:
    disposing a metal structure over a carrier;
    forming an opening in the metal structure disposed over the carrier;
    placing a chip on the carrier within the opening of the metal structure disposed over the carrier;
    fixing the chip to the metal structure;
    removing the carrier to thereby expose at least one contact of the chip and expose at least a portion of surface of the metal structure; and
    forming an electrically conductive connection between the at least one contact of the chip and the metal structure by forming an electrically conductive layer over the at least one contact of the chip and the at least exposed portion of the surface of the metal structure.

2. The method of claim 1,
    wherein forming the electrically conductive connection between the at least one contact of the chip and the metal structure comprises a plating process.

3. The method of claim 1,
    wherein forming the electrically conductive connection between the at least one contact of the chip and the metal structure comprises:
    depositing an electrically conductive material over the at least one contact of the chip and the at least exposed portion of the surface of the metal layer; and
    patterning the electrically conductive material.

4. The method of claim 1,
    wherein removing the carrier to thereby expose at least one contact of the chip comprises:
    removing the carrier from the chip and the metal structure; and
    forming at least one second opening to expose the at least one contact of the chip.

5. The method of claim 1,
    wherein the carrier comprises a metal or metal alloy.

6. The method of claim 1,
    wherein forming the electrically conductive connection between the at least one contact of the chip and the metal structure comprises:
    forming a plating mask over at least a part of the chip and over a first part of the at least exposed portion of the surface of the metal structure, wherein the at least one contact of the chip and a second part of the at least exposed portion of the surface of the metal structure are free from the plating mask; and
    plating the electrically conductive layer over the at least one contact of the chip and the second part of the at least exposed portion of the surface of the metal structure using the plating mask as a mask.

7. The method of claim 6, further comprising:
    patterning the electrically conductive layer.

8. The method of claim 1,
    wherein fixing the chip to the metal structure comprises:
    forming an insulating layer over the chip and the metal structure, wherein the insulating layer fills the opening of the metal structure.

9. The method of claim 8,
    wherein the insulating layer comprises at least one of a prepreg and a resin material.

10. The method of claim 1,
    wherein fixing the chip to the metal structure comprises:
    placing an insulating layer between a conductive layer and the chip and the metal structure disposed over the carrier; and
    applying heat and pressure to fuse the conductive layer, the insulating layer and the chip and the metal structure disposed over the carrier.

11. The method of claim 10,
    wherein the insulating layer fills the opening of the metal structure and is disposed over the chip and the metal structure.

12. The method of claim 1,
    wherein placing the chip on the carrier within the opening of the metal structure disposed over the carrier comprises:
    providing the metal structure disposed over a surface of the carrier;
    forming the opening in a part of the metal structure to expose a part of the surface of the carrier; and
    disposing the chip within the opening of the metal structure, and over the part of the surface of the carrier that is exposed.

13. The method of claim 12,
    wherein forming the opening in the part of the metal structure to expose the part of the surface of the carrier comprises an etching process.

14. The method of claim 12, further comprising:
    roughening the metal structure and the part of the surface of the carrier that is exposed.

15. The method of claim 14,
    wherein roughening the metal structure and the part of the surface of the carrier that is exposed comprises an etching process.

16. The method of claim 15,
    wherein the etching process comprises a micro-etching process.

17. The method of claim 12,
    wherein disposing the chip within the opening of the metal structure, and over the part of the surface of the carrier that is exposed comprises:
    disposing an adhesive over the part of the surface of the carrier that is exposed; and
    disposing the chip over the adhesive.

18. The method of claim 17,
    wherein the adhesive comprises a non-conductive material.

19. The method of claim 17,
    wherein the adhesive comprises a non-conductive paste.

20. The method of claim 17, further comprising:
    heating the adhesive after disposing the chip over the adhesive.

21. A method for manufacturing a chip arrangement, the method comprising:
- providing a metal structure disposed over a carrier;
- forming at least one first opening in the metal structure to expose at least a part of a surface of the carrier facing the metal structure;
- disposing at least one chip within the at least one first opening, wherein an adhesive layer attaches the at least one chip to the at least part of the surface of the carrier that is exposed;
- forming an insulating layer over the at least one chip and the metal structure, wherein the insulating layer fills the at least one first opening;
- forming at least one second opening in at least one of the insulating layer and the adhesive layer to expose at least one of a part of the at least one chip and a part of the metal structure; and
- plating an electrically conductive layer over the part of the at least one chip and the part of the metal structure that is exposed.

22. A method for manufacturing a chip arrangement, the method comprising:
- placing a chip on a carrier within an opening of the a metal structure disposed over the carrier;
- fixing the chip to the metal structure;
- removing the carrier to thereby expose at least one contact of the chip and expose at least a portion of the surface of the metal structure; and
- forming an electrically conductive connection between the at least one contact of the chip and the metal structure;
- wherein forming the electrically conductive connection between the at least one contact of the chip and the metal structure comprises:
    - forming a plating mask over at least a part of the chip and over a first part of the at least exposed portion of the surface of the metal structure, wherein the at least one contact of the chip and a second part of the surface of the metal structure are free from the plating mask; and
    - plating an electrically conductive layer over the at least one contact of the chip and the second part of the at least exposed portion of the surface of the metal structure using the plating mask as a mask, and
- patterning the electrically conductive layer.

23. A method for manufacturing a chip arrangement, the method comprising:
- placing a chip on a carrier within an opening of the a metal structure disposed over the carrier;
- fixing the chip to the metal structure;
- removing the carrier to thereby expose at least one contact of the chip and expose at least a portion of a surface of the metal structure; and
- forming an electrically conductive connection between the at least one contact of the chip and the metal structure;
- wherein fixing the chip to the metal structure comprises:
    - placing an insulating layer between a conductive layer and the chip and the metal structure disposed over the carrier; and
    - applying heat and pressure to fuse the conductive layer, the insulating layer and the chip and the metal structure disposed over the carrier.

24. The method of claim 23,
- wherein the insulating layer fills the opening of the metal structure and is disposed over the chip and the metal structure.

25. A method for manufacturing a chip arrangement, the method comprising:
- placing a chip on a carrier within an opening of the a metal structure disposed over the carrier;
- fixing the chip to the metal structure;
- removing the carrier to thereby expose at least one contact of the chip and expose at least a portion of the surface of the metal structure; and
- forming an electrically conductive connection between the at least one contact of the chip and the metal structure;
- wherein removing the carrier to thereby expose at least one contact of the chip comprises:
    - removing the carrier from the chip and the metal structure; and
    - forming at least one second opening to expose the at least one contact of the chip.

* * * * *